(12) United States Patent
Park et al.

(10) Patent No.: US 11,798,498 B2
(45) Date of Patent: Oct. 24, 2023

(54) METHOD OF MANUFACTURING A THIN-FILM TRANSISTOR HAVING AN ACTIVE LAYER FORMED USING ATOMIC LAYER DEPOSITION

(71) Applicants: Samsung Display Co., Ltd., Yongin-si (KR); IUCF-HYU (Industry-University Cooperation Foundation Hanyang University), Seoul (KR)

(72) Inventors: Joon Seok Park, Yongin-si (KR); Jun Hyung Lim, Seoul (KR); Jin Seong Park, Seoul (KR); Jiazhen Sheng, Seoul (KR); Tae Hyun Hong, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 17/887,901

(22) Filed: Aug. 15, 2022

(65) Prior Publication Data

US 2022/0398983 A1    Dec. 15, 2022

Related U.S. Application Data

(62) Division of application No. 16/782,973, filed on Feb. 5, 2020, now Pat. No. 11,417,282.

(30) Foreign Application Priority Data

Feb. 20, 2019  (KR) .................. 10-2019-0020017

(51) Int. Cl.
G09G 3/3291    (2016.01)
G09G 3/3266    (2016.01)
(Continued)

(52) U.S. Cl.
CPC ......... G09G 3/3291 (2013.01); G09G 3/3266 (2013.01); H01L 27/1225 (2013.01);
(Continued)

(58) Field of Classification Search
CPC .............. G09G 3/3291; G09G 3/3266; H01L 27/1225; H01L 29/7869; H01L 29/78648;
(Continued)

(56) References Cited

U.S. PATENT DOCUMENTS 8,507,916 B2 *   8/2013   Misaki ............... H01L 29/7869
                                                          257/43
8,536,611 B2 *   9/2013   Aratani ................ H10K 50/11
                                                          313/499

(Continued)

FOREIGN PATENT DOCUMENTS

KR    10-2015-0113041    10/2015
KR    10-2018-0121573    11/2018
(Continued)

OTHER PUBLICATIONS

Non-Final Office Action dated Jan. 3, 2022, in U.S. Appl. No. 16/782,973.
(Continued)

*Primary Examiner* — Caleb E Henry
(74) *Attorney, Agent, or Firm* — H.C. Park & Associates, PLC

(57) ABSTRACT

A method of manufacturing a display device including a pixel which is connected to a scan line and a data line intersecting the scan line. The pixel includes a light emitting element and a driving transistor controlling a driving current, which is supplied to the light emitting element, according to a data voltage received from the data line. The driving transistor includes a first active layer having an oxide semiconductor containing tin (Sn).

6 Claims, 27 Drawing Sheets

(51) Int. Cl.
  *H01L 29/786* (2006.01)
  *H01L 27/12* (2006.01)
  *H10K 59/131* (2023.01)
  *H10K 59/121* (2023.01)
  *H10K 71/00* (2023.01)
  *H10K 59/12* (2023.01)
  *H10K 102/10* (2023.01)

(52) U.S. Cl.
  CPC ..... *H01L 29/7869* (2013.01); *H10K 59/1213* (2023.02); *H10K 59/131* (2023.02); *H10K 71/00* (2023.02); *H10K 59/1201* (2023.02); *H10K 2102/102* (2023.02); *H10K 2102/103* (2023.02)

(58) Field of Classification Search
  CPC ............ H01L 27/3272; H01L 27/3262; H01L 27/3246; H01L 27/3248; H01L 27/3276; H01L 29/66969; H01L 29/78633; H01L 21/0228; H01L 27/1214; H01L 27/3211; H01L 29/78606; H01L 29/78618; H01L 51/56; H01L 2251/303; H10K 59/1213; H10K 59/131; H10K 71/00; H10K 59/1201; H10K 2102/102; H10K 2102/103
  See application file for complete search history.

(56) References Cited

U.S. PATENT DOCUMENTS

| | | | |
|---|---|---|---|
| 8,729,552 B2 * | 5/2014 | Kim | H01L 29/78696 438/23 |
| 8,912,985 B2 | 12/2014 | Miyake | |
| 9,171,960 B2 | 10/2015 | Hong et al. | |
| 9,178,073 B2 | 11/2015 | Miki et al. | |
| 9,590,111 B2 | 3/2017 | Yamazaki | |
| 10,468,535 B2 | 11/2019 | Morita et al. | |
| 2012/0074414 A1 * | 3/2012 | Lee | H01L 27/124 257/E33.012 |
| 2012/0104396 A1 * | 5/2012 | Pyo | H01L 27/1255 438/34 |
| 2013/0256653 A1 * | 10/2013 | Ahn | H01L 29/78696 257/E21.462 |
| 2014/0110707 A1 * | 4/2014 | Koezuka | H01L 29/513 257/43 |
| 2014/0353643 A1 * | 12/2014 | Seo | H10K 71/60 438/23 |
| 2016/0240557 A1 | 8/2016 | Xu et al. | |
| 2016/0284854 A1 | 9/2016 | Okazaki et al. | |
| 2016/0315201 A1 * | 10/2016 | Lee | H01L 29/66969 |
| 2018/0033858 A1 * | 2/2018 | Moon | H01L 21/0262 |
| 2018/0350995 A1 * | 12/2018 | Kim | H01L 27/1225 |
| 2019/0123207 A1 | 4/2019 | Goto et al. | |
| 2019/0171048 A1 | 6/2019 | Kang | |
| 2020/0265789 A1 * | 8/2020 | Park | G09G 3/3291 |

FOREIGN PATENT DOCUMENTS

| | | |
|---|---|---|
| KR | 10-1914921 | 11/2018 |
| WO | 2011-126093 | 10/2011 |

OTHER PUBLICATIONS

Notice of Allowance dated Apr. 12, 2022, in U.S. Appl. No. 16/782,973.

* cited by examiner

METHOD OF MANUFACTURING A THIN-FILM TRANSISTOR HAVING AN ACTIVE LAYER FORMED USING ATOMIC LAYER DEPOSITION

This application is a Divisional of U.S. application Ser. No. 16/782,973, filed Feb. 5, 2020, which claims priority from and the benefit of Korean Patent Application No. 10-2019-0020017, filed on Feb. 20, 2019, each of which is hereby incorporated by reference for all purposes as if fully set forth herein.

BACKGROUND

Field

Exemplary embodiments of the invention relate generally to a display device and a method of manufacturing the same, and more specifically, to a display device including an oxide thin-film transistor manufactured by atomic layer deposition (ALD) and a method of manufacturing the display device.

Discussion of the Background

Display devices are becoming increasingly important with the development of multimedia. Accordingly, various types of display devices such as organic light emitting displays (OLEDs) and liquid crystal displays (LCDs) are being used.

Display devices are for displaying images and include a display panel such as an organic light-emitting display panel or a liquid-crystal display panel. Among them, light-emitting display panel may include light-emitting elements. For example, light-emitting diodes (LEDs) may include an organic light-emitting diode (OLED) using an organic material as a fluorescent material, and an inorganic light-emitting diode using an inorganic material as a fluorescent material. Such a display device includes a display panel, a gate driver circuit, a data driver circuit, and a timing controller. The display panel includes data lines, gate lines, and pixels formed at intersections of the data lines and the gate lines, By using a thin-film transistor as a switching element, each of the pixels receives a data voltage from a data line when a gate signal is supplied to a gate line. Each of the pixels emits light of a predetermined brightness according to the data voltage.

Recently, display devices capable of displaying ultra-high definition (UHD) images are being released, and display devices capable of displaying 8K UHD images are being developed. UHD represents a resolution of 3840×2160, and 8K UHD represents a resolution of 7680×4320.

In the case of a high-resolution display device, as the number of pixels increases, a driving current of each pixel may decrease, thereby reducing the driving voltage range of a driving transistor of each pixel.

The above information disclosed in this Background section is only for understanding of the background of the inventive concepts, and, therefore, it may contain information that does not constitute prior art.

SUMMARY

Exemplary embodiments of the inventive concepts provide a method of forming a thin-film transistor having an active layer containing a specific amount of metal atoms by using atomic layer deposition (ALD).

Exemplary embodiments of the inventive concepts also provide a display device including the thin-film transistor.

Additional features of the inventive concepts will be set forth in the description which follows, and in part will be apparent from the description, or may be learned by practice of the inventive concepts.

According to one or more exemplary embodiments of the inventive concepts, a display device includes a pixel which is connected to a scan line and a data line intersecting the scan line, wherein the pixel includes a light emitting element and a driving transistor controlling a driving current, which is supplied to the light emitting element, according to a data voltage received from the data line, wherein the driving transistor includes a first active layer having an oxide semiconductor containing tin (Sn).

In an exemplary embodiment, content of the tin in the oxide semiconductor ranges from about 10 wt. % to about 16 wt. %.

In an exemplary embodiment, the tin is dispersed in the oxide semiconductor.

In an exemplary embodiment, the oxide semiconductor includes indium-tin oxide (ITO), indium-zinc-tin oxide (IZTO), indium-gallium-tin oxide (IGTO), or indium-gallium-zinc-tin oxide (IGZTO).

In an exemplary embodiment, the oxide semiconductor includes at least one first oxide layer containing tin and at least one second oxide layer containing indium (In).

In an exemplary embodiment, the oxide semiconductor has a structure in which the first oxide layer and the second oxide layer are alternately stacked.

In an exemplary embodiment, the oxide semiconductor further includes at least one third oxide layer containing zinc (Zn) and has a structure in which the first through third oxide layers are stacked in one direction.

In an exemplary embodiment, the first active layer includes a first surface in the one direction and a second surface located opposite the first surface, and the tin content of an area adjacent to the first surface and the tin content of an area adjacent to the second surface have different values.

In an exemplary embodiment, the tin content of the first active layer decreases linearly from the first surface toward the second surface.

In an exemplary embodiment, the first active layer includes a first conducting region, a second conducting region, and a channel region disposed between the first conducting region and the second conducting region.

In an exemplary embodiment, the driving transistor further includes a first light shielding layer disposed under the first active layer; a first gate electrode disposed on the first active layer; a first source electrode connected to the first conducting region through a first contact hole passing through an interlayer insulating layer disposed on the first gate electrode; and a first drain electrode connected to the second conducting region through a second contact hole passing through the interlayer insulating layer.

In an exemplary embodiment, the pixel includes a scan transistor for applying the data voltage of the data line to a gate electrode of the driving transistor according to a scan signal transmitted to the scan line, wherein the scan transistor includes a second active layer having an oxide semiconductor containing tin.

In an exemplary embodiment, content of the tin in the second active layer ranges from about 10 wt. % to about 16 wt. %.

According to one or more exemplary embodiments of the inventive concepts, a method of manufacturing a display device includes forming an active layer, which includes at least one oxide layer, on a target substrate using atomic layer deposition (ALD); and forming at least one thin-film transistor including the active layer.

In an exemplary embodiment, the oxide layer includes at least one first oxide layer containing indium and at least one second oxide layer containing tin.

In an exemplary embodiment, the forming of the active layer includes performing an ALD cycle for forming the at least one oxide layer at least once, and the ALD cycle includes a first deposition cycle for forming the first oxide layer on the target substrate and a second deposition cycle for forming the second oxide layer on the first oxide layer.

In an exemplary embodiment, wherein the ALD cycle further includes a third deposition cycle for forming a third oxide layer containing zinc between the second oxide layer and the first oxide layer.

In an exemplary embodiment, in the ALD cycle, the second deposition cycle is performed one or more times, and the first deposition cycle and the third deposition cycle are performed in equal proportions.

In an exemplary embodiment, the active layer includes indium-tin oxide (ITO), indium-zinc-tin oxide (IZTO), indium-gallium-tin oxide (IGTO), or indium-gallium-zinc-tin oxide (IGZTO).

In an exemplary embodiment, content of the tin in the active layer ranges from about 10 wt. % to about 16 wt. %.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
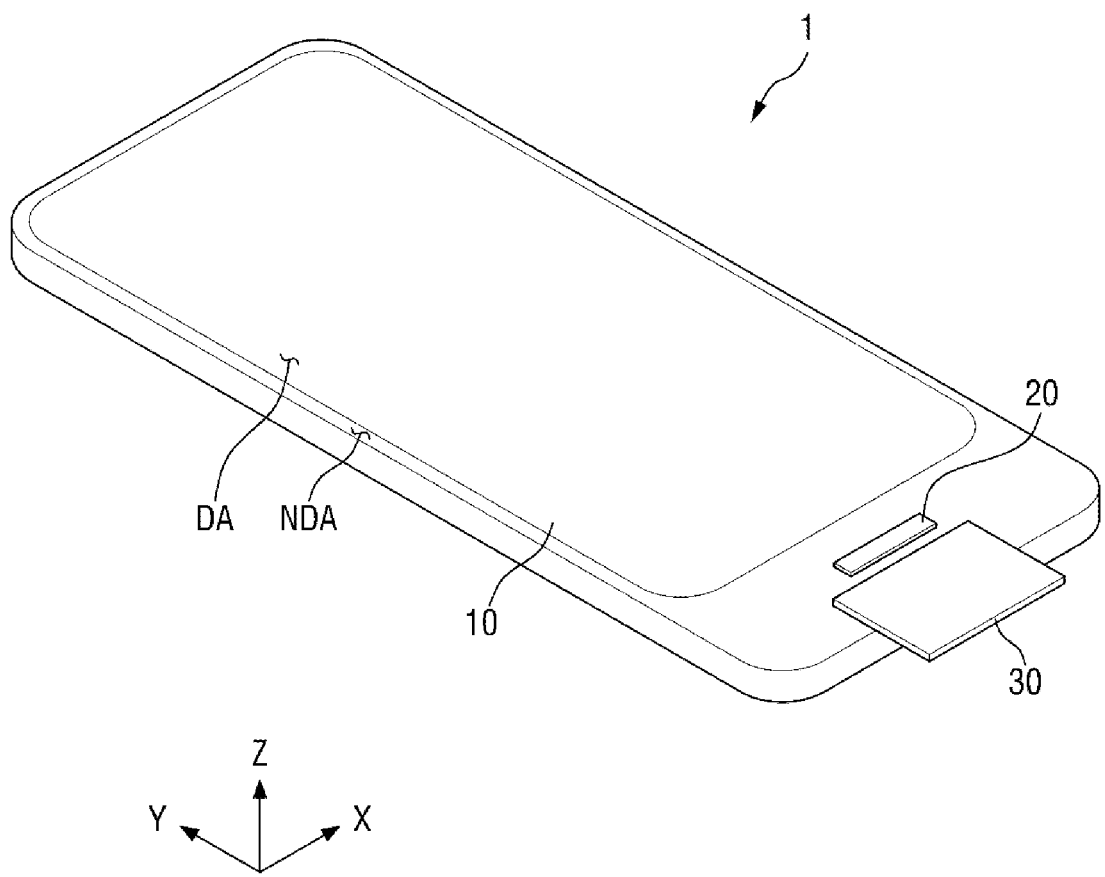
FIG. 1 is a perspective view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
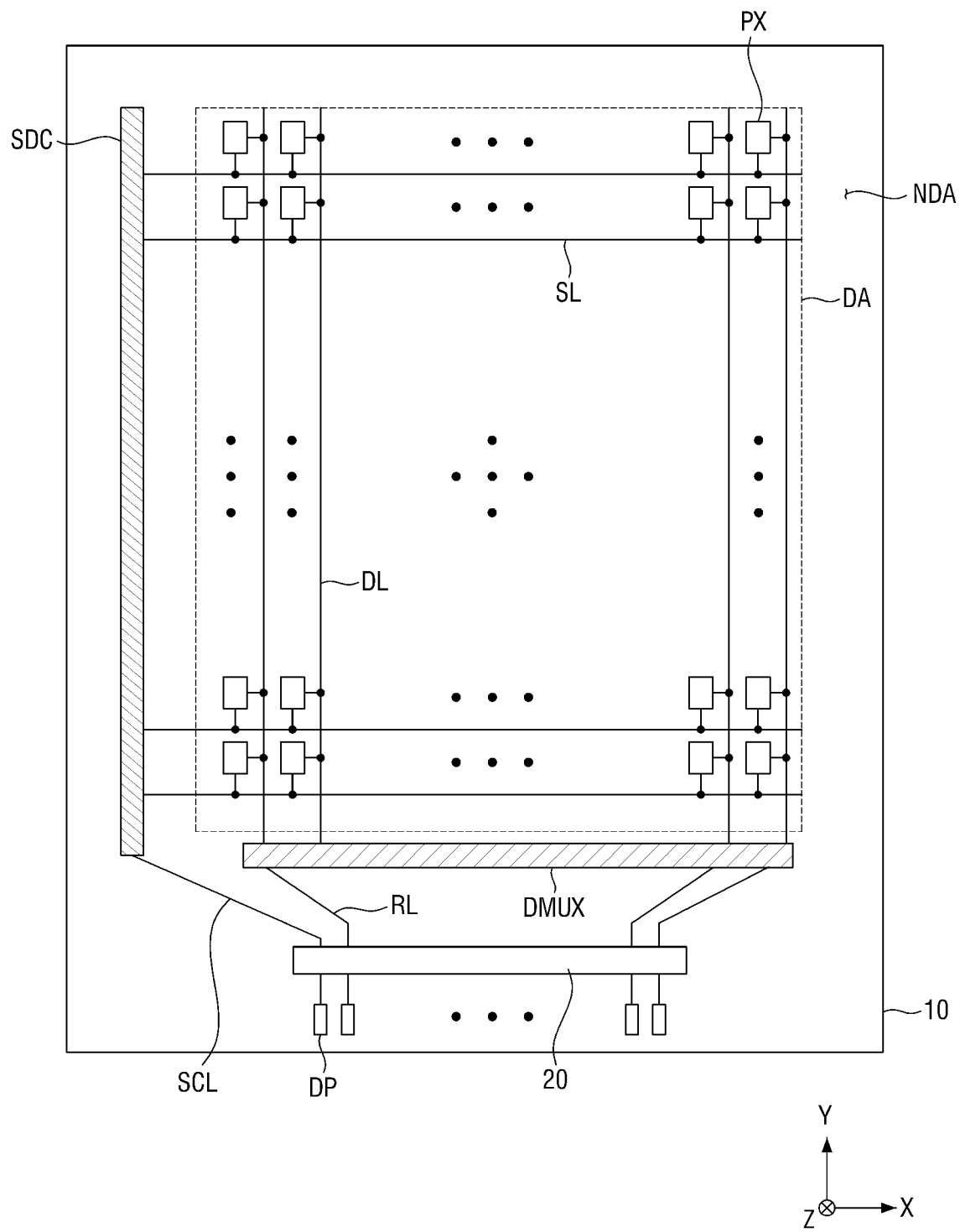
FIG. 2 is a schematic plan view of the display device according to the exemplary embodiment.

FIG. 1 is a perspective view of a display device 1 according to an exemplary embodiment. FIG. 2 is a schematic plan view of the display device 1 according to the exemplary embodiment.

In the present specification, the terms "above", "top" and "upper surface" indicate an upward direction from a display panel 10, that is, a Z-axis direction, and the terms "below," "bottom" and "lower surface" indicate a direction opposite to the Z-axis direction. In addition, "left," "right," "upper" and "lower" indicate directions when the display panel 10 is viewed in a plane. For example, "left" indicates a direction opposite to an X-axis direction, "right" indicates the X-axis direction, "upper" indicates a Y-axis direction, and "lower" indicates a direction opposite to the Y-axis direction.

Referring to FIGS. 1 and 2, the display device 1 is a device for displaying moving images or still images. The display device 1 may be used as a display screen in portable electronic devices such as a mobile phone, a smartphone, a tablet personal computer (PC), a smart watch, a watch phone, a mobile communication terminal, an electronic notebook, an electronic book, a portable multimedia player (PMP), a navigation system and a ultra-mobile PC (UMPC), as well as in various products such as a television, a notebook computer, a monitor, a billboard and the Internet of things (IoT). The display device 1 may be any one of an organic light emitting display, a liquid crystal display, a plasma display, a field emission display, an electrophoretic display, an electrowetting display, a quantum dot light emitting display, and a micro light emitting diode (LED) display. An organic light emitting display will hereinafter be described as an example of the display device 1, but exemplary embodiments are not limited to the organic light emitting display.

The display device 1 according to the exemplary embodiment includes the display panel 10, a display driver circuit 20, and a circuit board 30.

The display panel 10 may be formed as a rectangular plane having short sides in a first direction (X-axis direction) and long sides in a second direction (Y-axis direction), Each corner where a long side extending in the first direction (X-axis direction) meets a short side extending in the second direction (Y-axis direction) may be rounded with a predetermined curvature or may be right-angled. The planar shape of the display panel 10 is not limited to the rectangular shape, but may also be another polygonal shape, a circular shape, or an elliptical shape. The display panel 10 may be formed flat. However, the display panel 10 is not limited to this example and may also include a curved portion formed at its left and right ends and having a constant curvature or a varying curvature. In addition, the display panel 10 may be formed flexible so that it can be curved, bent, folded, or rolled.

The display panel 10 may include a display area DA where a plurality of pixels PX are formed to display an image and a non-display area NDA disposed around the display area DA. When the display panel 10 includes a curved portion, the display area DA may also be disposed in the curved portion. In this case, an image of the display panel 10 may also be displayed in the curved portion.

In the display area DA, not only the pixels PX but also scan lines SL, data lines DL and power supply lines connected to the pixels PX may be disposed. The scan lines SL may be formed parallel to each other in the first direction (X-axis direction), and the data lines DL may be formed parallel to each other in the second direction (Y-axis direction) intersecting the first direction (X-axis direction). Each of the pixels PX may be connected to at least one of the scan liens SL and one of the data lines DL.

Each of the pixels PX may include a driving transistor DT, at least one switching transistor ST, a light emitting element, and a capacitor. Since the switching transistor ST is turned on by a scan signal received from a scan line SL, a data voltage of a data line DL may be applied to a gate electrode of the driving transistor DT. The driving transistor DT may supply a driving current to the light emitting element according to the data voltage applied to the gate electrode, thereby causing the light emitting element to emit light. The driving transistor DT and the at least one switching transistor ST may be thin-film transistors. The light emitting element may emit light according to the driving current of the driving transistor DT. The light emitting element may be an organic light emitting diode including a first electrode, an organic light emitting layer, and a second electrode. The capacitor may keep the data voltage applied to the gate electrode of the driving transistor DT constant.

The non-display area NDA may be defined as an area extending from the outside of the display area DA to edges of the display panel 10. In the non-display area NDA, a scan driver circuit SDC for transmitting scan signals to the scan lines SL and a data voltage distribution circuit DMUX connected between the data lines DL and routing lines RL may be disposed. In addition, pads DP electrically connected to the display drier circuit 20 and the circuit board 30 may be disposed in the non-display area NDA. In this case, the display driver circuit 20 and the pads DP may be disposed on an edge of the display panel 10.

The scan driver circuit SDC may be connected to the display driver circuit 20 through at least one scan control line SCL. The scan driver circuit SDC may receive a scan control signal from the display driver circuit 20 through the at least one scan control line SCL. The scan driver circuit SDC may generate scan signals according to the scan control signal and sequentially output the scan signals to the scan lines SL. Although the scan driver circuit SDC is formed in the non-display area NDA on a side (e.g., a left side) of the display area DA in FIG. 2, exemplary embodiments are not limited to this case. For example, the scan driver circuit SDC may also be formed in the non-display area NDA on both sides (e.g., left and right sides) of the display area DA.

The data voltage distribution circuit DMUX may be connected between the routing lines RL and the data lines DL. A ratio of the number of the routing lines RL connected to the data voltage distribution circuit DMUX to the number of the data lines DL connected to the data voltage distribution circuit DMUX may be 1:q, where q is an integer equal to or greater than 2. The data voltage distribution circuit DMUX may distribute data voltage applied to the routing lines RL to a plurality of data lines DL.

The display driver circuit 20 is connected to the display pads DP and receives digital video data and timing signals. The display driver circuit 20 converts the digital video data into analog positive/negative polarity data voltages and supplies the analog positive/negative polarity data voltages to the data lines DL through the routing lines RL and the data voltage distribution circuit DMUX. In addition, the display driver circuit 20 generates the scan control signal for controlling the scan driver circuit SDC and supplies the scan control signal to the scan driver circuit SDC through the scan control line SCL. Pixels PX to be supplied with the data voltages are selected by the scan signals of the scan driver circuit SDC, and the data voltages are supplied to the selected pixels PX. In addition, the display driver circuit 20 may supply power supply voltages to the power supply lines.

The display driver circuit 20 may be formed as an integrated circuit (IC) and mounted on the display panel 10 in a pad area PDA using a chip-on-glass (COG) method, a chip-on-plastic (COP) method, or an ultrasonic bonding method. However, exemplary embodiments are not limited to this case, and the display driver circuit 20 may also be mounted on the circuit board 30.

The pads DP may be electrically to the display driver circuit 20. The circuit board 30 may be attached onto the pads DP using an anisotropic conductive film. Therefore, lead lines of the circuit board 30 may be electrically connected to the pads DP. The circuit board 30 may be a flexible printed circuit board, a printed circuit board, or a flexible film such as a chip on film.

Figure 3:
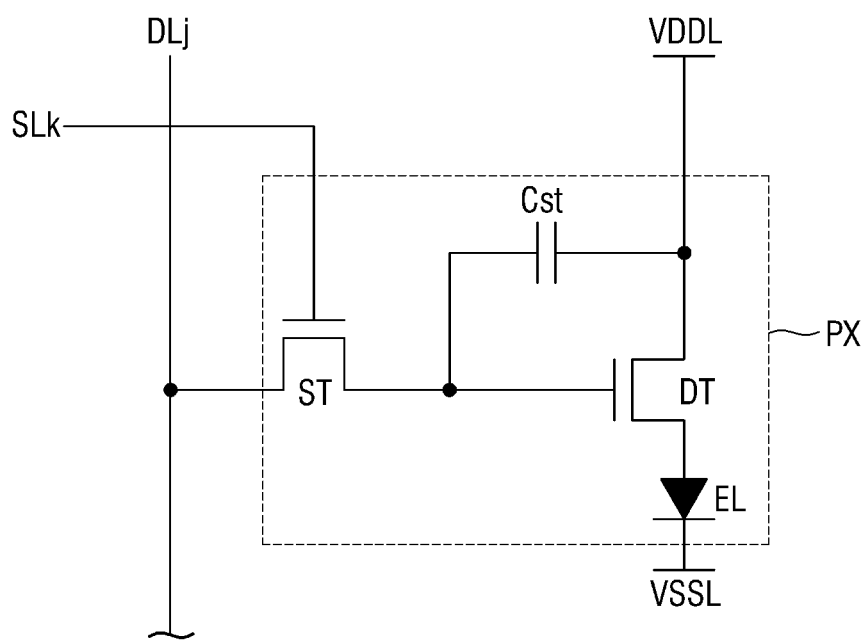
FIG. 3 is a circuit diagram of a pixel illustrated in FIG. 2.

FIG. 3 is a circuit diagram of a pixel PX illustrated in FIG. 2.

Referring to FIG. 3, the pixel PX may include a driving transistor DT, at least one switching transistor ST, a light emitting element EL, and a capacitor Cst.

The switching transistor ST is turned on by a scan signal received from a $k^{th}$ scan line SLk (where k is a positive integer). Therefore, a data voltage of a $j^{th}$ data line DLj (where j is a positive integer) may be applied to a gate electrode of the driving transistor DT. The switching transistor ST may have a gate electrode connected to the $k^{th}$ scan line SLk, a source electrode connected to the gate electrode of the driving transistor DT, and a drain electrode connected to the $j^{th}$ data line DLj.

The driving transistor DT may supply a driving current to the light emitting element EL according to the data voltage applied to the gate electrode, thereby causing the light emitting element EL to emit light. The driving transistor DT may have the gate electrode connected to the drain electrode of the switching transistor ST, a source electrode connected to a first electrode of the light emitting element EL, and a drain electrode connected to a first power supply line VDDL to which a first power supply voltage is applied.

The driving transistor DT and the at least one switching transistor ST may be thin-film transistors. In addition, although the driving transistor DT and the at least one switching transistor ST are formed as N-type semiconductor transistors having N-type semiconductor characteristics in FIG. 3, exemplary embodiments are not limited to this case. That is, the driving transistor DT and the at least one switching transistor ST may also be formed as P-type semiconductor transistors having P-type semiconductor characteristics.

The light emitting element EL may emit light according to the driving current of the driving transistor DT. The light emitting element EL may be an organic light emitting diode including the first electrode, an organic light emitting layer, and a second electrode. The first electrode of the light emitting element EL may be connected to the drain electrode of the driving transistor DT, and the second electrode may be connected to a second power supply line VSSL to which a second power supply voltage lower than the first power supply voltage is applied.

The capacitor Cst may be connected between the gate electrode and the source electrode of the driving transistor DT. Therefore, the capacitor Cst may keep the data voltage applied to the gate electrode of the driving transistor DT constant.

The structures and arrangement of members in each pixel PX will now be described.

Figure 4:
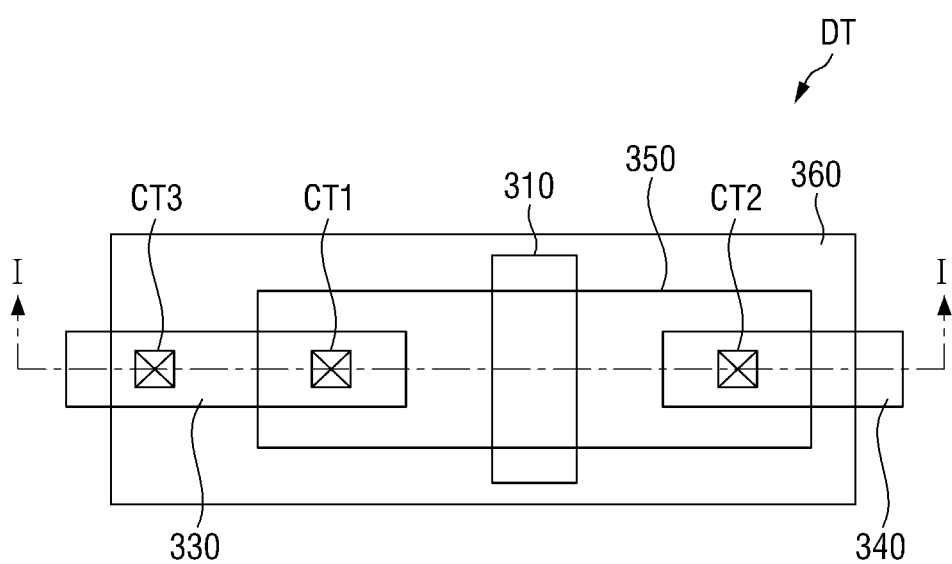
FIG. 4 is a plan view of a driving transistor according to an exemplary embodiment.
Figure 5:
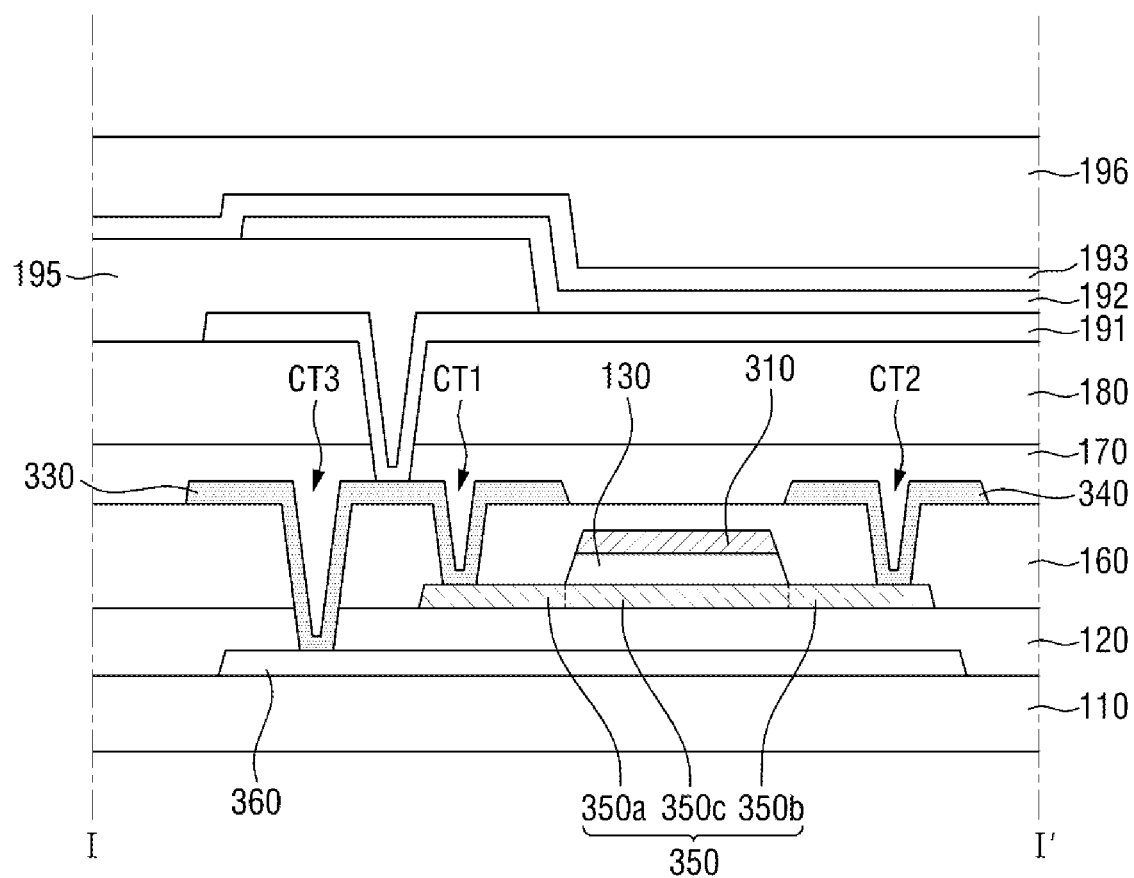
FIG. 5 is a cross-sectional view taken along line I-I' of FIG. 4.
Figure 6:
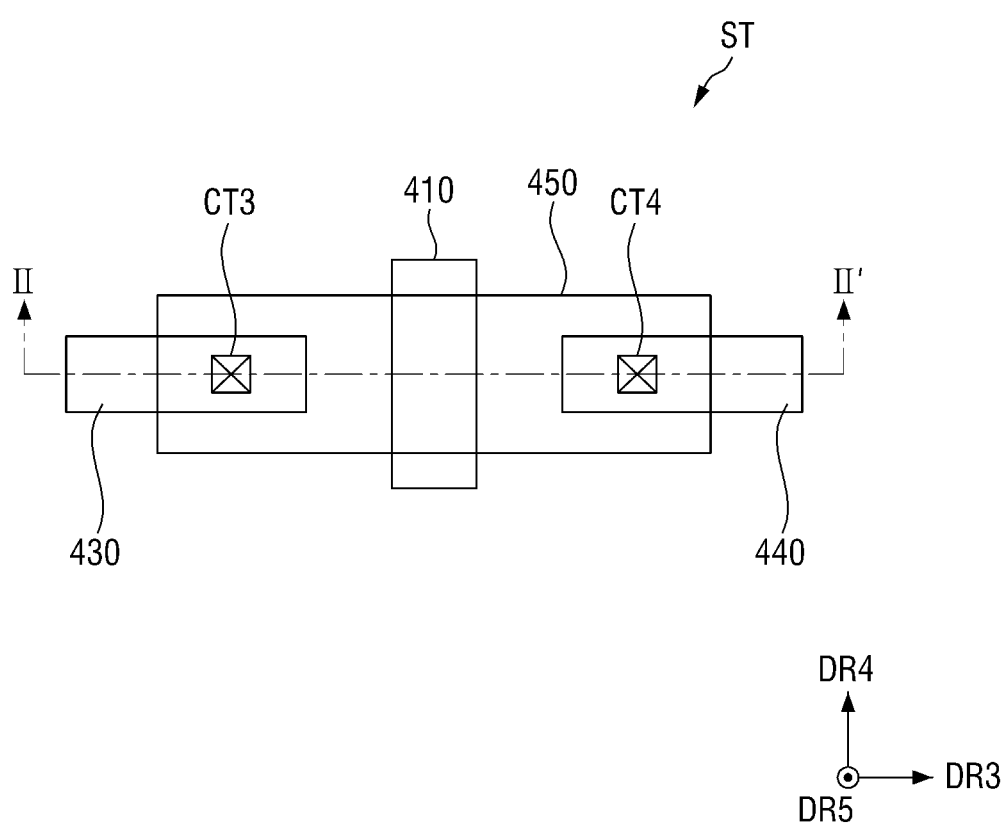
FIG. 6 is a plan view of a switching transistor according to an exemplary embodiment.
Figure 7:
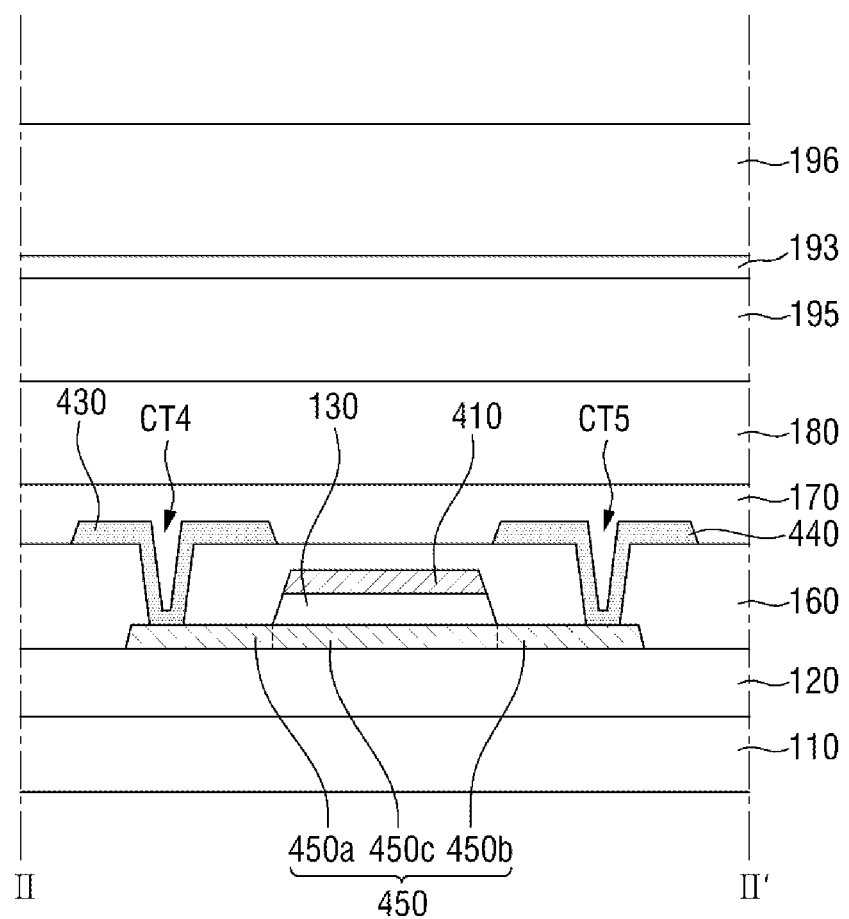
FIG. 7 is a cross-sectional view taken along line II-II' of FIG. 6.

FIG. 4 is a plan view of a driving transistor DT according to an exemplary embodiment. FIG. 5 is a cross-sectional view taken along line I-I' of FIG. 4. FIG. 6 is a plan view of a switching transistor ST according to an exemplary embodiment. FIG. 7 is a cross-sectional view taken along line II-II' of FIG. 6.

In FIGS. 4 through 7, the driving transistor DT and the switching transistor ST of each pixel PX are formed in a coplanar structure. The coplanar structure has a top-gate structure in which a gate electrode is formed on an active layer. However, exemplary embodiments are not limited to this structure, and the driving transistor DT and the switching transistor ST of each pixel PX may also have a bottom-gate structure in which a gate electrode is formed under an active layer.

Referring to FIGS. 4 through 7, each pixel PX of the display panel 10 includes a first substrate 110, a buffer layer 120, a first gate insulating layer 130, the driving transistor DT, the switching transistor ST, a first interlayer insulating layer 160, a first protective layer 170, a first planarization layer 180, a first electrode 191, an organic light emitting layer 192, a second electrode 193, a pixel defining layer 195, and an encapsulation layer 196.

The driving transistor DT of each pixel PX includes a first gate electrode 310, a first active layer 350, a first source electrode 330, a first drain electrode 340, and a first light shielding layer 360. The switching transistor ST of each pixel PX includes a second gate electrode 410, a second active layer 450, a second source electrode 430, and a second drain electrode 440.

The first substrate 110 may provide an area where the driving transistor DT and the switching transistor ST are formed. The first substrate 110 may be made of plastic or glass.

The first light shielding layer 360 may be disposed on the first substrate 110. The first light shielding layer 360 may block light from the first substrate 110 from entering the first active layer 350. The first light shielding layer 360 may prevent a leakage current that flows through the first active layer 350 when light from the first substrate 110 is incident on the first active layer 350. Lengths of the first light shielding layer 360 in a fourth direction DR4 and a fifth direction DR5 may be greater than lengths of the first active layer 350 in the fourth direction DR4 and the fifth direction DR5. The first light shielding layer 360 may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The buffer layer 120 may be disposed on the first light shielding layer 360. The buffer layer 120 may protect the driving transistor DT and the switching transistor ST of each pixel PX from moisture introduced through the first substrate 110. The buffer layer 120 may be composed of a plurality of inorganic layers stacked alternately. For example, the buffer layer 120 may be a multilayer in which one or more inorganic layers selected from a silicon oxide (SiOx) layer, a silicon nitride (SiNx) layer, and SiON are alternately stacked.

The first active layer 350 and the second active layer 450 may be disposed on the buffer layer 120. The first active layer 350 and the second active layer 450 may include first conducting regions 350a and 450a, second conducting regions 350b and 450b, and channel regions 350c and 450c, respectively. The channel regions 350c and 450c may be disposed between the first conducting regions 350a and 450a and the second conducting regions 350b and 450b.

According to an exemplary embodiment, the first active layer 350 and the second active layer 450 may be oxide semiconductors containing tin (Sn). In an exemplary embodiment, the first active layer 350 and the second active layer 450 may include indium-tin oxide (ITO), indium-zinc-tin oxide (IZTO), indium-gallium-tin oxide (IGTO), or indium-gallium-zinc-tin oxide (IGZTO).

When the active layers 350 and 450 of the driving transistor DT and the switching transistor ST are made of oxide semiconductors containing tin, device characteristics, electrical characteristics, chemical resistance, etc. of the transistors can be improved. An active layer of a conventional oxide semiconductor is formed on a substrate by sputtering. However, with sputtering, it is difficult to control the content of a specific metal in the oxide semiconductor, and the reliability of the oxide semiconductor produced conventionally is low.

In a method of manufacturing the display device 1 according to the exemplary embodiment, an oxide semiconductor containing tin may be formed using atomic layer deposition (ALD). In ALD, an atomic thin film may be formed on a surface of a target substrate by injecting a precursor material and depositing the precursor material on the target substrate. According to an exemplary embodiment, the method of manufacturing the display device 1 includes performing at least one ALD cycle, and the content of a specific metal in a produced semiconductor oxide may be controlled according to the number of ALD cycles.

When the active layers 350 and 450 of the driving transistor DT and the switching transistor ST are oxide semiconductors containing tin as described above, the active layers 350 and 450 formed through ALD may contain a specific amount of tin. The tin content of the oxide semiconductors of the active layers 350 and 450 may be controlled by repeating an operation of forming tin oxide (SnO) in an ALD process. In an exemplary embodiment, the active layers 350 and 450 of the driving transistor DT and the switching transistor ST may contain about 10 wt. % to about 16 wt. % of tin. This will be described in more detail later.

The first gate insulating layer 130 is disposed on the first active layer 350 and the second active layer 450. The first gate insulating layer 130 may be made of an inorganic material such as silicon oxide (SiOx), silicon nitride (SiNx), or a stack of the same.

The first gate electrode 310 and the second gate electrode 410 are disposed on the first gate insulating layer 130. The first gate electrode 310 may overlap the first active layer 350 with the first gate insulating layer 130 interposed between them, and the second gate electrode 410 may overlap the second active layer 450 with the first gate insulating layer 130 interposed between them. Specifically, the first gate electrode 310 may overlap the channel region 350c of the first active layer 350, and the second gate electrode 410 may overlap the channel region 450c of the second active layer 450. Each of the first gate electrode 310 and the second gate electrode 410 may be a single layer or a multilayer made of any one or more of molybdenum (Mo), aluminum (Al), chromium (Cr), gold (Au), titanium (Ti), nickel (Ni) neodymium (Nd), copper (Cu), and alloys of the same.

Although the first gate insulating layer 130 is disposed only between the first gate electrode 310 and the first active layer 350 and between the second gate electrode 410 and the second active layer 450 in FIGS. 5 and 7, exemplary embodiments are not limited to this case. That is, the first gate insulating layer 130 may also be formed on upper and side surfaces of the first active layer 350 and the second active layer 450.

The first interlayer insulating layer 160 is disposed on the first gate electrode 310 and the second gate electrode 410. The first interlayer insulating layer 160 may be made of an inorganic material such as silicon oxide (SiOx), silicon nitride (SiNx), or a stack of the same.

A first contact hole CT1 passing through the first interlayer insulating layer 160 to expose a portion of the upper surface of the first active layer 350 and a second contact hole CT2 passing through the first interlayer insulating layer 160 to expose another portion of the upper surface of the first active layer 350 may be formed in the first interlayer insulating layer 160. That is, the first contact hole CT1 may expose the first conducting region 350a of the first active layer 350, and the second contact hole CT2 may expose the second conducting region 350b of the first active layer 350. In addition, a third contact hole CT3 passing through the first interlayer insulating layer 160 and the buffer layer 120 to expose the light shielding layer 360 may be formed in the first interlayer insulating layer 160 and the buffer layer 120.

In addition, a fourth contact hole CT4 passing through the first interlayer insulating layer 160 to expose a portion of the upper surface of the second active layer 450 and a fifth contact hole CT5 passing through the first interlayer insulating layer 160 to expose another portion of the upper surface of the second active layer 450 may be formed in the first interlayer insulating layer 160. That is, the fourth contact hole CT4 may expose the first conducting region 450a of the second active layer 450, and the fifth contact hole CT5 may expose the second conducting region 450b of the second active layer 450.

The first source electrode 330 and the first drain electrode 340 of the driving transistor DT and the second source electrode 430 and the second drain electrode 440 of the switching transistor ST are disposed on the first interlayer insulating layer 160.

The first source electrode 330 contacts the first conducting region 350a formed on a side of the first active layer 350 through the first contact hole CT1. The first drain electrode 340 contacts the second conducting region 350b formed on the other side of the first active layer 350 through the second contact hole CT2.

The second source electrode 430 contacts the first conducting region 450a formed on a side of the second active layer 450 through the fourth contact hole CT4. The second drain electrode 440 contacts the second conducting region 450b formed on the other side of the second active layer 450 through the fifth contact hole CT5.

The first protective layer 170 is disposed on the respective source electrodes 330 and 430 and the respective drain electrodes 340 and 440 of the driving transistor DT and the switching transistor ST. The first protective layer 170 may be made of an inorganic material such as silicon oxide (SiOx), silicon nitride (SiNx), or a stack of the same.

The first planarization layer 180 is disposed on the first protective layer 170. The first planarization layer 180 may flatten steps due to thin-film transistors such as the driving transistor DT and the switching transistor ST. The first planarization layer 180 may be made of an organic layer such as acryl resin, epoxy resin, phenolic resin, polyamide resin, or polyimide resin.

A light emitting element EL, which includes the first electrode 191, the organic light emitting layer 192 and the second electrode 193, and the pixel defining layer 195 may be formed on the first planarization layer 180.

The first electrode 191 may be formed on the first planarization layer 180. The first electrode 191 may be connected to the first source electrode 330 of the driving transistor DT through a contact hole CNT passing through the first protective layer 170 and the first planarization layer 180.

The pixel defining layer 195 may be formed on the first planarization layer 180 and may cover edges of the first electrode 191 to define pixels. That is, the pixel defining layer 195 serves as a pixel defining layer for defining pixels. Here, each of the pixels is an area in which the first electrode 191, the organic light emitting layer 192 and the second electrode 193 are sequentially stacked so that holes from the first electrode 191 and electrons from the second electrode 193 combine together in the organic light emitting layer 192 to emit light.

The organic light emitting layer 192 may be disposed on the first electrode 191 and the pixel defining layer 195. The organic light emitting layer 192 may include a hole transporting layer, a light emitting layer, and an electron transporting layer. In addition, the organic light emitting layer 192 may be formed in a tandem structure of two stacks or more, in which case a charge generating layer may be formed between the stacks.

The second electrode 193 may be formed on the organic light emitting layer 192. The second electrode 193 may be a common layer common to all pixels.

The light emitting element EL may be of a top emission type which emits light in an upward direction. In this case, the first electrode 191 may be made of a metal material having high reflectivity, such as a stack (Ti/Al/Ti) of aluminum (Al) and titanium (Ti), a stack (ITO/Al/ITO) of aluminum and indium-tin oxide (ITO), an APC alloy, or a stack (ITO/APC/ITO) of an APC alloy and ITO. The APC alloy is an alloy of silver (Ag), palladium (Pd), and copper (Cu). In addition, the second electrode 193 may be made of a transparent conductive material (TCO) capable of transmitting light such as ITO or indium-zinc oxide (IZO) or may be made of a semi-transmissive conductive material such as magnesium (Mg), silver (Ag) or an alloy of magnesium and silver. When the second electrode 193 is made of a semi-transmissive conductive material, the light emission efficiency may be increased by a microcavity.

The encapsulation layer 196 may be formed on the second electrode 193 to prevent introduction of oxygen or moisture. The encapsulation layer 196 may include at least one inorganic layer. The inorganic layer may be made of silicon nitride, aluminum nitride, zirconium nitride, titanium nitride, hafnium nitride, tantalum nitride, silicon oxide, aluminum oxide, or titanium oxide. In addition, the encapsulation layer 196 may include at least one organic layer to prevent particles from penetrating the encapsulation layer 196 and entering the organic light emitting layer 192 and the second electrode 193. The organic layer may be made of epoxy, acrylate, or urethane acrylate.

As described above, the driving transistor DT and the switching transistor ST may also have a bottom-gate structure in which the gate electrodes 310 and 410 are disposed under the active layers 350 and 450.

Figure 8:
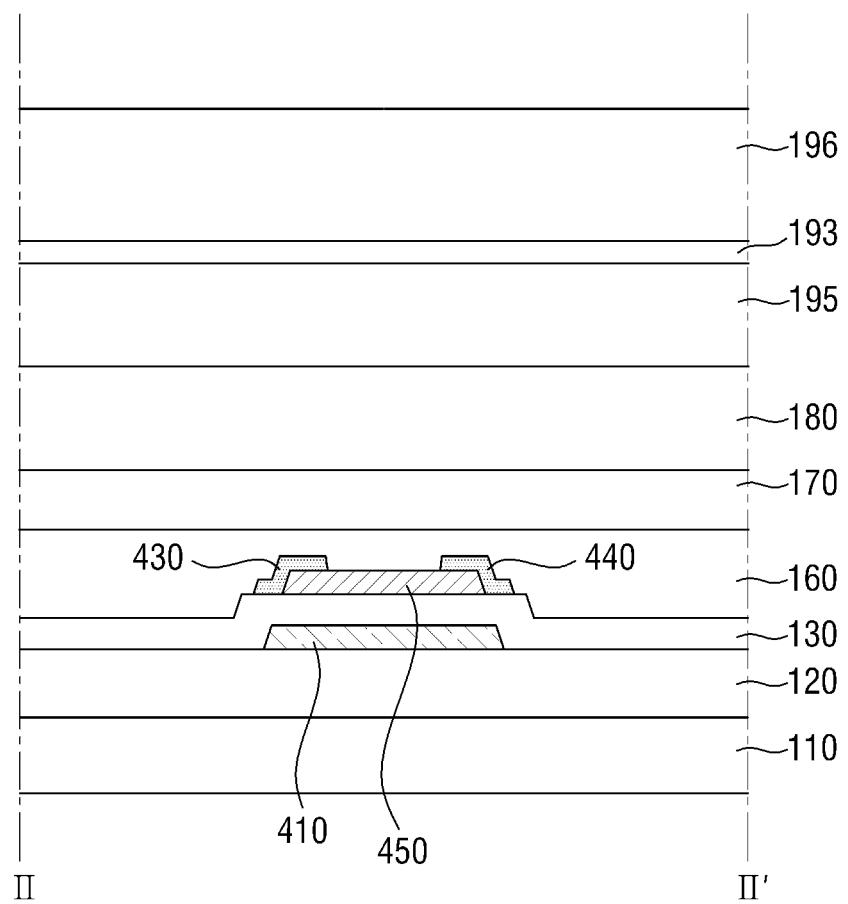
FIG. 8 is a cross-sectional view of a switching transistor according to an exemplary embodiment.

FIG. 8 is a cross-sectional view of a switching transistor ST according to an exemplary embodiment.

Although only the switching transistor ST has a bottom-gate structure in FIG. 8, exemplary embodiments are not limited to this case, and the driving transistor DT may also have the same structure. The switching transistor ST of FIG. 8 is the same as the switching transistor ST of FIG. 7 except for the arrangement structure of a first gate insulating layer 130, a second gate electrode 410, a second active layer 450, a second source electrode 430 and a second drain electrode 440. Thus, differences will be described in detail below.

Referring to FIG. 8, the switching transistor ST may have a structure in which the second gate electrode 410 is formed under the second active layer 450. Specifically, the second gate electrode 410 may be disposed on a buffer layer 120, and the first gate insulating layer 130 may cover the second gate electrode 410 and may be disposed on the entire surface of the buffer layer 120.

The second active layer 450 is disposed on the first gate insulating layer 130, and the second source electrode 430 and the second drain electrode 440 are disposed on a portion of the second active layer 450 and a portion of the first gate insulating layer 130. The second active layer 450 may overlap the second gate electrode 410. The second active layer 450 may overlap the second gate electrode 410 while being insulated from the second gate electrode 410 with the first gate insulating layer 130 interposed between them. The second source electrode 430 and the second drain electrode 440 partially overlap a side and the other side of the second active layer 450, respectively.

Unlike in the switching transistor ST of FIG. 7, the second source electrode 430 and the second drain electrode 440 may directly contact the second active layer 450 without through contact holes. The second active layer 450 may be an oxide semiconductor containing tin as described above. Other details are the same as those described above with reference to FIG. 7, and thus a detailed description thereof is omitted.

As described above, the active layers 350 and 450 of the driving transistor DT and the switching transistor ST according to the exemplary embodiment may be formed by ALD. In FIGS. 5 and 7, the first and second active layers 350 and 450 include one integrated oxide semiconductor layer. However, since the first active layer 350 and the second active layer 450 are formed by ALD, they may also include a plurality of oxide layers and have a structure in which the oxide layers are stacked. That is, the first active layer 350 and the second active layer 450 may include at least one oxide layer containing tin oxide (SnO).

Figure 9:
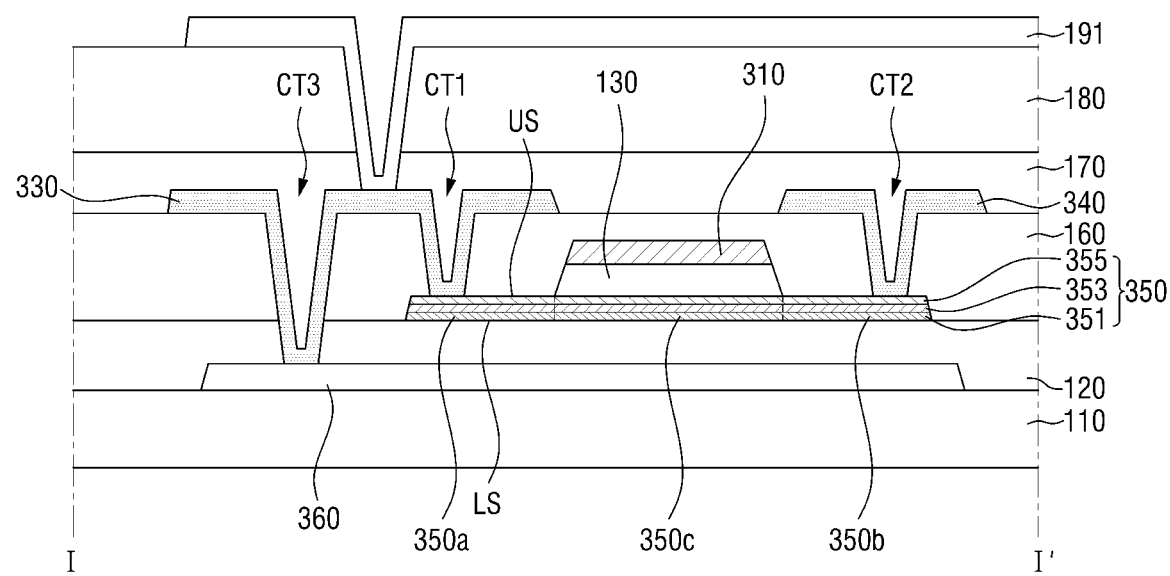
FIG. 9 is a cross-sectional view of a driving transistor according to an exemplary embodiment.

FIG. 9 is a cross-sectional view of a driving transistor DT according to an exemplary embodiment. Although the driving transistor DT includes a first active layer 350 composed of a plurality of oxide layers in FIG. 9, exemplary embodiments are not limited to this case, and the switching transistor ST may also have the same structure. The driving transistor DT of FIG. 9 is the same as the driving transistor DT of FIG. 5 except that the first active layer 350 has a structure in which a plurality of oxide layers are stacked. The first active layer 350 of the driving transistor DT of FIG. 9 will now be described in detail.

According to an exemplary embodiment, the first active layer 350 may include at least one oxide layer. The first active layer 350 may include a first oxide layer 351, a second oxide layer 353 and a third oxide layer 355 and may have a structure in which the first through third oxide layers 351, 353 and 355 are stacked in one direction. At least any one of the first through third oxide layers 351, 353 and 355 may include tin oxide (SnO).

The first oxide layer 351, the second oxide layer 353 and the third oxide layer 355 may include metallic oxide. They may include different metallic oxides according to the composition of the first active layer 350. For example, when the first active layer 350 includes indium-zinc-tin oxide (IZTO), the first oxide layer 351 may include indium oxide ($In_2O_3$), the second oxide layer 353 may include zinc oxide (ZnO), and the third oxide layer 355 may include tin oxide (SnO). The types of the first through third oxide layers 351, 353 and 355 may form various combinations, but at least one oxide layer may include tin oxide. In addition, any one oxide layer may be omitted, and only two oxide layers may be formed. Alternatively, a larger number of oxide layers may be formed.

When the first active layer 350 is formed by ALD, each of the oxide layers 351, 353 and 355 may be formed by performing one ALD cycle. That is, the first active layer 350 of FIG. 9 may be formed by performing a total of three ALD cycles including a first cycle for forming the first oxide layer 351, a second cycle for forming the second oxide layer 353 and a third cycle for forming the third oxide layer 355.

According to an exemplary embodiment, the content of a specific metal in the first active layer 350 may be controlled by adjusting the number of ALD cycles for forming any one of the first through third oxide layers 351, 353 and 355 and a ratio between ALD cycles. For example, when the first active layer 350 is an oxide semiconductor containing tin and the third oxide layer 355 contains tin oxide, the tin content of the first active layer 350 may be controlled by adjusting the ratio between the number of ALD cycles for forming the first oxide layer 351 and the second oxide layer 353 and the number of ALD cycles for forming the third oxide layer 355. When the number of ALD cycles for forming the third oxide layer 355 is increased, the tin content of the first active layer 350 may increase.

In an exemplary embodiment, the first active layer 350 may contain about 10 wt. % to about 16 wt. % of tin. In this case, metal atoms other than the tin contained in the first active layer 350, for example, indium (In), zinc (Zn) and gallium (Ga) atoms may be contained in the first active layer 350 in equal proportions. That is, the first active layer 350 may contain tin in the above range and a certain amount of oxygen (O), and the balance may contain other metal atoms in equal proportions. However, exemplary embodiments are not limited to this case.

Since the first active layer 350 contains tin in the above range, the driving transistor DT may have excellent device characteristics, electrical characteristics and chemical resistance. In particular, since the active layers 350 and 450 of the driving transistor DT and the switching transistor ST have chemical resistance, they have an excellent etching rate in a patterning process for forming other inorganic or organic layers of the display device 1. Therefore, the number of operations in a manufacturing process can be reduced.

In addition, the first active layer 350 is produced by stacking at least one oxide layer using ALD. Therefore, defects that may be formed in the oxide semiconductor can be minimized.

When an oxide semiconductor is formed by ALD, it may have a structure in which a plurality of oxide layers 351, 353 and 355 are stacked. However, exemplary embodiments are not limited to this case. After the ALD cycle process is performed, a heat treatment process may be performed to integrate the oxide layers 351, 353 and 355 into one oxide semiconductor, thereby forming the first active layer 350 as illustrated in FIG. 5. In this case, the tin content of the first active layer 350 may have a uniform distribution regardless of the position in the first active layer 350.

On the other hand, when a plurality of oxide layers are stacked as separate layers by producing an oxide semiconductor using ALD as in the case of the first active layer 350 of FIG. 9, the tin content may vary according to position in the first active layer 350. According to an exemplary embodiment, the tin content of the first active layer 350 may be different in an area adjacent to an upper surface US of the first active layer 350 and an area adjacent to a lower surface LS.

For example, when the third oxide layer 355 is tin oxide, the tin content of the first active layer 350 may be greater in the area adjacent to the upper surface US of the first active layer 350 than in the area adjacent to the lower surface LS. Conversely, when the first oxide layer 351 is tin oxide, the tin content of the first active layer 350 may be greater in the area adjacent to the lower surface LS of the first active layer 350 than in the area adjacent to the upper surface US. Accordingly, the tin content may change stepwise from the upper surface US of the first active layer 350 toward the lower surface LS according to the composition of each of the oxide layers 351, 353 and 355. However, even if the first active layer 350 according to an exemplary embodiment has different tin content according to position, the content of tin in the entire oxide semiconductor may range from about 10 wt. % to about 16 wt. %.

In addition, the tin content of the first active layer 350 can have various distributions without increasing or decreasing stepwise according to position in the first active layer 350. In some cases, the tin content of the first active layer 350 may change linearly according to position in the first active layer 350 or may repeatedly increase or decrease according to the number of ALD cycles repeated. This will be described in detail later with reference to other exemplary embodiments.

A method of manufacturing the display device 1 including the driving transistor DT and the switching transistor ST described above will now be described.

Figure 10:
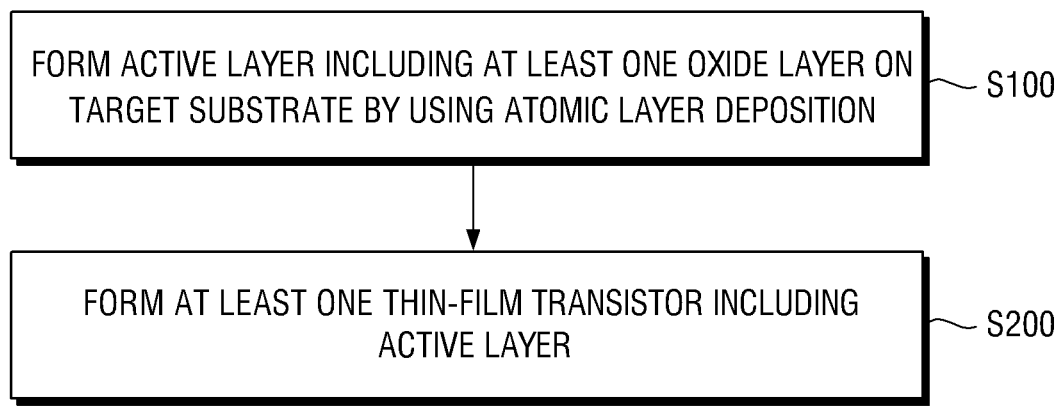
FIG. 10 is a flowchart illustrating a method of manufacturing a display device according to an exemplary embodiment.

FIG. 10 is a flowchart illustrating a method of manufacturing a display device according to an exemplary embodiment.

Referring to FIG. 10, the method of manufacturing the display device 1 according to the exemplary embodiment may include forming an active layer, which includes at least one oxide layer, on a target substrate using ALD (operation S100) and forming at least one thin-film transistor including the active layer (operation S200).

The driving transistor DT and the switching transistor ST included in the display panel 10 of the display device 1 may include the active layers 350 and 450 having oxide semiconductors that contain tin. In the method of manufacturing the display device 1 according to the exemplary embodiment, the oxide semiconductors containing tin may be formed using ALD. As described above, the active layers 350 and 450 of the driving transistor DT and the switching transistor ST may each include one or more oxide layers and have a structure in which the oxide layers are stacked. The oxide semiconductors of the active layers 350 and 450 according to the exemplary embodiment may be formed by repeating a cycle of depositing each oxide layer using ALD.

Figure 11:
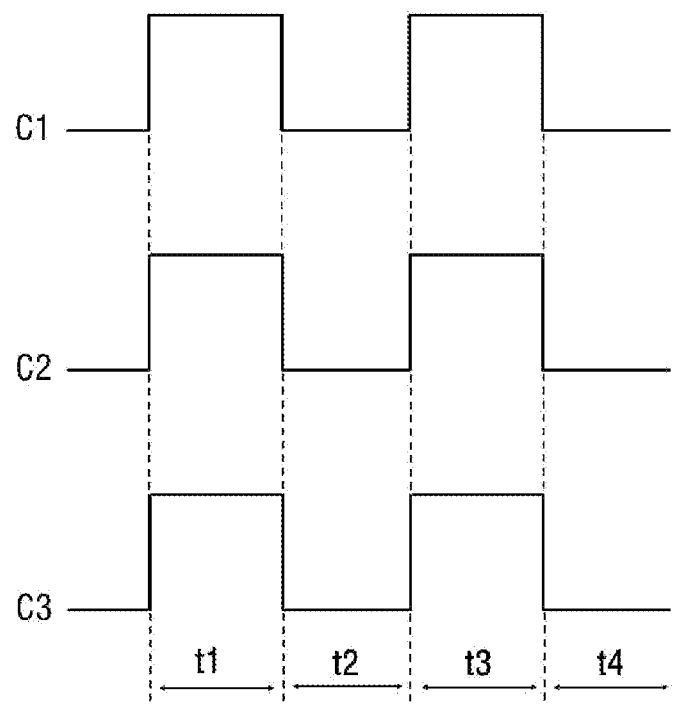
FIGS. 11 and 12 are schematic graphs illustrating deposition cycles for forming oxide layers according to an exemplary embodiment.
Figure 12:
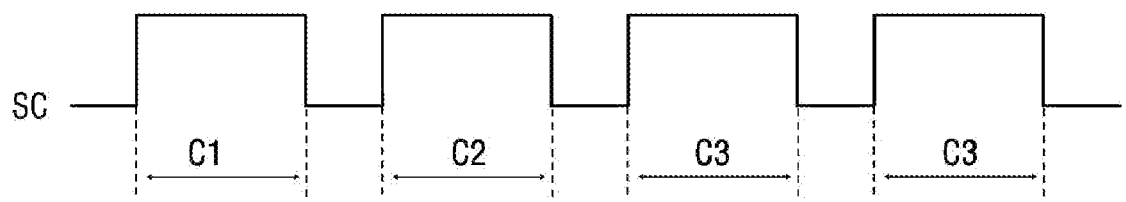
Figure 13:
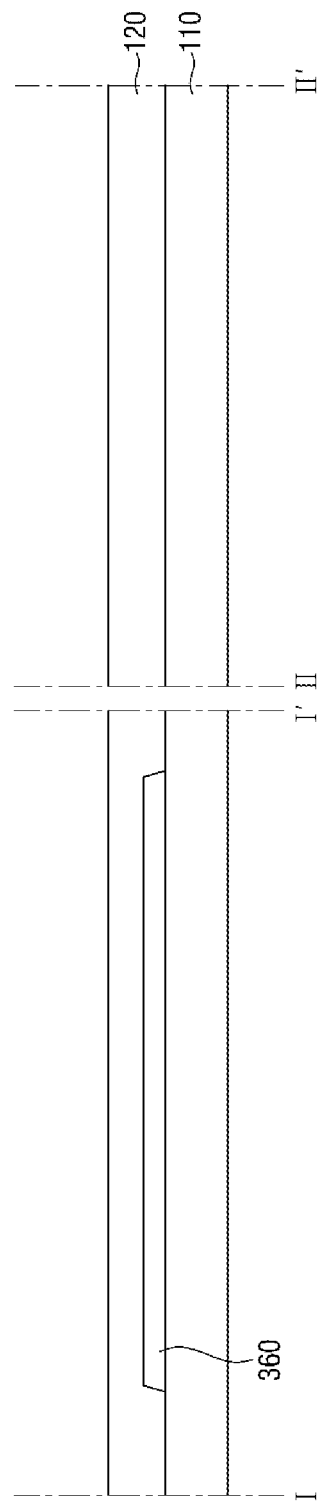
FIGS. 13, 14, 15, 16, 17, 18, and 19 are schematic cross-sectional views illustrating a method of manufacturing a display device according to an exemplary embodiment.
Figure 14:
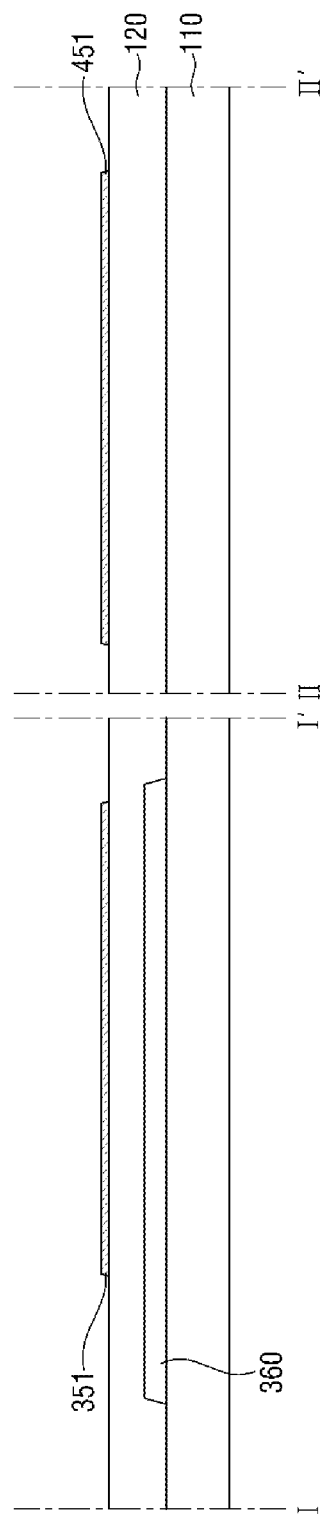
Figure 15:
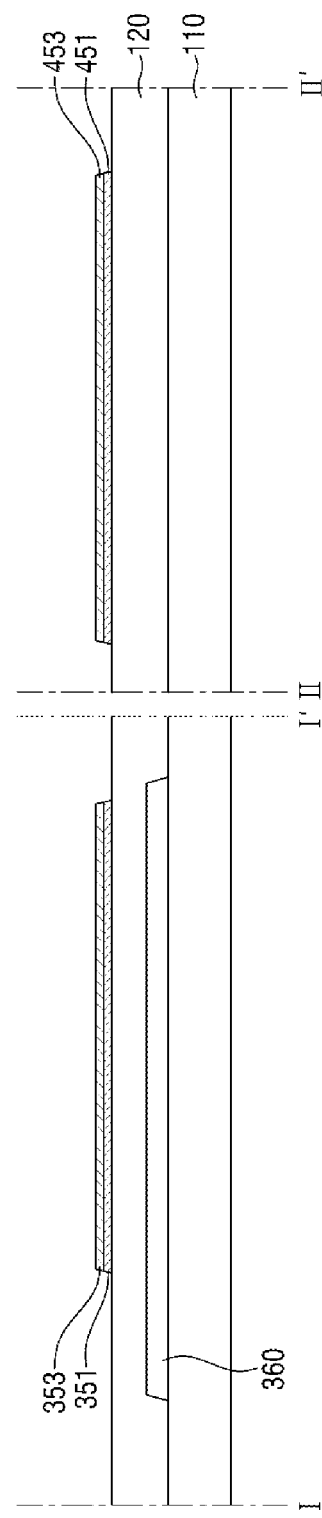

FIG. 11 illustrates schematic graphs showing deposition cycles for forming oxide layers according to an exemplary embodiment. FIG. 12 illustrates a schematic graph showing an ALD cycle for forming an oxide semiconductor of an active layer according to an exemplary embodiment.

FIG. 11 illustrates graphs showing deposition cycles C1, C2 and C3 for forming the oxide layers 351, 353 and 355 included in each of the oxide semiconductors of the active layers 350 and 450, and FIG. 12 illustrates a graph showing an ALD cycle SC including each of the deposition cycles C1, C2 and C3 at least once.

A case where each of the active layers 350 and 450 includes three oxide layers, that is, the first oxide layer 351, the second oxide layer 353 and the third oxide layer 355 will be described as an example.

Referring to FIGS. 11 and 12, the first oxide layer 351, the second oxide layer 353 and the third oxide layer 355 included in each of the active layers 350 and 450 may be formed respectively through a first deposition cycle C1, a second deposition cycle C2 and a third deposition cycle C3 performed using ALD.

Each of the deposition cycles C1 through C3 may include a first precursor injection operation t1, a first purge operation t2, a second precursor injection operation t3 and a second purge operation t4 to form the oxide layer 351, 353 or 355.

The first precursor injection operation t1 and the second precursor injection operation t3 are operations of injecting precursor molecules containing atoms that constitute each of the oxide layers 351, 353 and 355. For example, when the first oxide layer 351 is tin oxide, the first precursor injection operation t1 may be an operation of injecting a tin precursor, and the second precursor injection operation t3 may be an operation of injecting an oxygen precursor such as hydrogen peroxide ($H_2O_2$).

When each precursor is injected, a thin film having an atomic-level thickness may be formed on a target substrate. When a tin precursor is injected in the first precursor injection operation t1, a thin film containing tin may be formed on the target substrate. When hydrogen peroxide is injected in the second precursor injection operation t3, a tin oxide thin film may be formed.

The first purge operation t2 and the second purge operation t4 are operations of removing undeposited residues after the first precursor injection operation t1 and the second precursor injection operation t3. For example, the first purge operation t2 and the second purge operation t4 may be operations of discharging a first precursor and a second precursor by injecting a gas such as argon (Ar) or nitrogen ($N_2$).

Each of the deposition cycles C1 through C3 includes the precursor injection operations t1 and t2 and the purge operations t2 and t4 to form the oxide layer 351, 353 or 355. After one deposition cycle C1, C2 or C3 is performed, another deposition cycle C1, C2 or C3 is performed so that a plurality of oxide layers 351, 353 and 355 can be stacked.

According to an exemplary embodiment, the ALD cycle SC may include one or more deposition cycles C1 through C3. Specifically, referring to FIG. 12, the ALD cycle SC may include one first deposition cycle C1, one second deposition cycle C2 and two third deposition cycles C3. In this case, a produced oxide semiconductor may include one first oxide layer 351, one second oxide layer 353 and two third oxide layers 355. However, exemplary embodiments are not limited to this case, and some of the deposition cycles C1 through C3 can be omitted, or more deposition cycles can be included.

The ALD cycle SC may control the content of a specific element in a produced oxide semiconductor by adjusting the number of specific oxide layers 351, 353 or 355 stacked by adjusting the number of deposition cycles C1, C2 or C3.

Since each of the active layers 350 and 450 according to the exemplary embodiment contains about 10 wt. % to about 16 wt. % of tin as described above, the ALD cycle SC may control the content of tin in the active layers 350 and 450 by adjusting the number of deposition cycles for forming tin oxide.

For example, when the first oxide layer 351 is indium oxide, the second oxide layer 353 is zinc oxide and the third oxide 355 is tin oxide, the first deposition cycle C1 may be performed to form the first oxide layer 351 of indium oxide, the second deposition cycle C2 may be performed to form the second oxide layer 353 of zinc oxide, and the third deposition cycle C3 may be performed to form the third oxide layer 355 of tin oxide.

The ALD cycle SC may include the first deposition cycle C1 and the second deposition cycle C2 in equal proportions so that the oxide semiconductors of the active layers 350 and 450 contain equal amounts of indium and zinc. In addition, the tin content of the oxide semiconductors may be controlled by adjusting the ratio of the third deposition cycle C3 to the first and second deposition cycles C1 and C2 in the ALD cycle SC. That is, in the method of manufacturing the display device 1 according to the exemplary embodiment, it is possible to adjust the ratio between the deposition cycles C1, C2 and C3 respectively for forming the oxide layers 351, 353 and 355 in the ALD cycle SC and thus possible to form an oxide semiconductor containing a specific element in a specific amount.

The method of manufacturing the display device 1 will now be described with reference to other drawings.

FIGS. 13 through 19 are schematic cross-sectional views illustrating a method of manufacturing a display device according to an exemplary embodiment. FIGS. 13 through 19 include a cross section taken along line I-I' of FIG. 5 and a cross section taken along line II-II' of FIG. 7.

Referring to FIGS. 13 through 19, first, a target substrate is prepared. The target substrate includes a first substrate 110, a first light shielding layer 360, and a buffer layer 120. The arrangement of these elements is the same as that described above, and thus a detailed description thereof is omitted.

Next, first oxide layers 351 and 451 are formed on the buffer layer 120. The first oxide layers 351 and 451 may be formed by performing the first deposition cycle C1 illustrated in FIGS. 11 and 12. The first oxide layers 351 and 451 may be formed by repeatedly performing the precursor injection operations t1 and t3 and the purge operations t2 and t4 on the buffer layer 120. Since ALD is used to form the first oxide layers 351 and 451, the first oxide layers 351 and 451 having a desired thickness and composition can be formed directly on the buffer layer 120 without a separate patterning operation.

Next, second oxide layers 353 and 453 disposed on the first oxide layers 351 and 451 and third oxide layers 355 and 455 disposed on the second oxide layers 353 and 453 are formed to form a first active layer 350 and a second active layer 450 on the buffer layer 120. The first through third oxide layers may be sequentially formed in one direction from the buffer layer 120, for example, in a direction in which an upper surface of the buffer layer 120 faces. The second oxide layers 353 and 453 and the third oxide layers 355 and 455 may be formed by performing the second deposition cycle C2 and the third deposition cycle C3 of FIGS. 11 and 12, respectively.

In an exemplary embodiment, the first active layer 350 and the second active layer 450 may include indium-zinc-tin oxide (IZTO). In this case, the first oxide layers 351 and 451 may be indium oxide ($In_2O_3$), the second oxide layers 353 and 453 may be zinc oxide (ZnO), and the third oxide layers 355 and 455 may be tin oxide (SnO) as described above. In an exemplary embodiment, the ALD cycle SC may include one first deposition cycle C1, one second deposition cycle C2, and two third deposition cycles C3. When oxide semiconductors are formed through this ALD cycle SC, each of the first active layer 350 and the second active layer 450 may contain tin in the range of about 10 wt. % to about 16 wt. %.

However, exemplary embodiments are not limited to this case. The order of the deposition cycles C1 through C3 in the ALD cycle SC is not particularly limited as long as the ALD cycle SC includes a deposition cycle C1, C2 or C3 for forming an oxide layer of tin oxide so that each of the active layers 350 and 450 according to the exemplary embodiment can contain tin. For example, in the ALD cycle SC, the third deposition cycle C3 for forming the third oxide layers 355 and 455 of tin oxide may be disposed between the first deposition cycle C1 and the second deposition cycle C2. Accordingly, the tin content of the produced first active layers 350 and 450 may have various distributions according to position.

Figure 16:
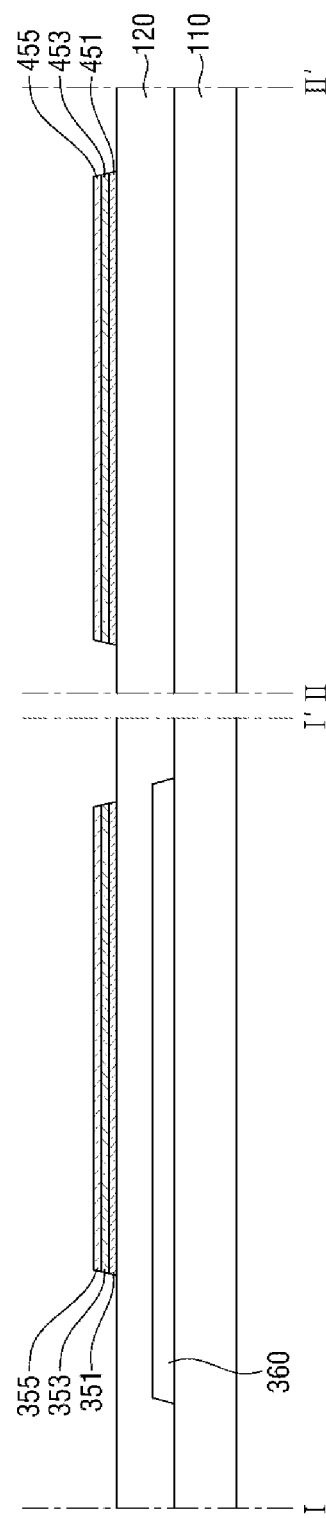

The oxide layers of each of the first active layer 350 and the second active layer 450 may have a boundary between them as illustrated in FIG. 16. However, exemplary embodiments are not limited to this case, and the oxide layers can be integrated into one oxide semiconductor as illustrated in FIGS. 5 and 7. The oxide layers can be integrated into one oxide semiconductor by performing a predetermined heat treatment process after the ALD cycle SC.

Figure 17:
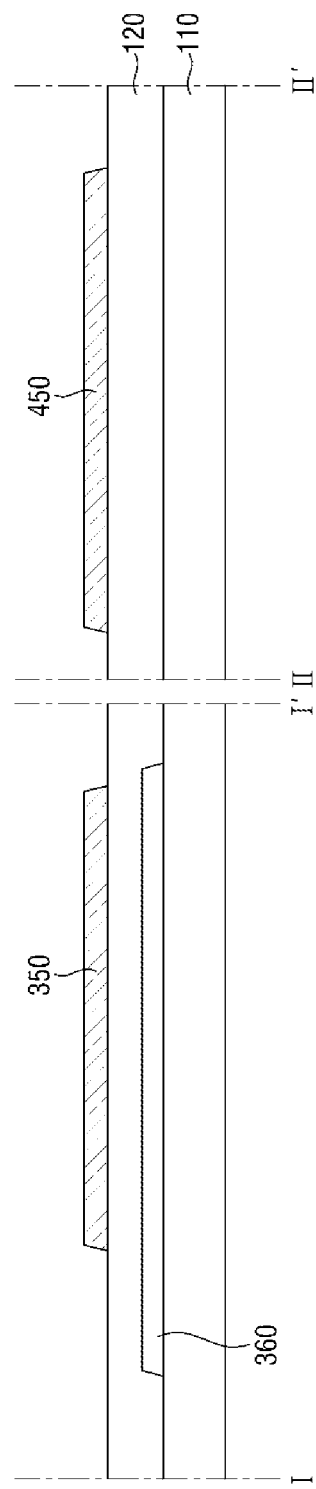

As illustrated in FIG. 17, according to an exemplary embodiment, a heat treatment process may be performed after the ALD cycle SC to integrate each of the first active layer 350 and the second active layer 450 into one oxide semiconductor. Accordingly, the content of tin in each of the first active layer 350 and the second active layer 450 may be uniform regardless of the position in the oxide semiconductor.

Figure 18:
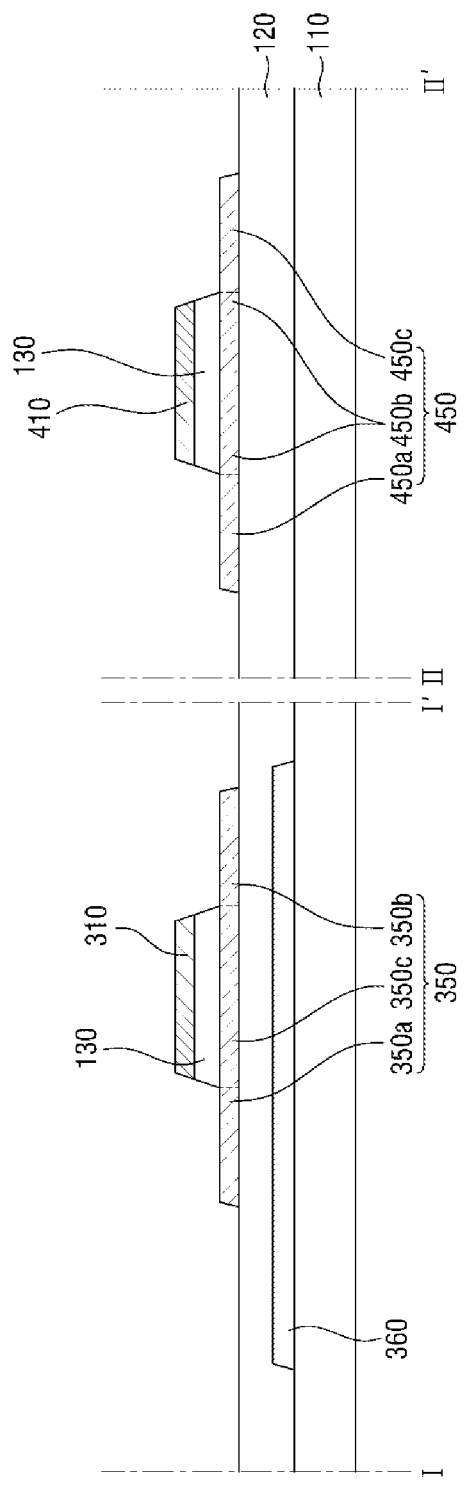
Figure 19:
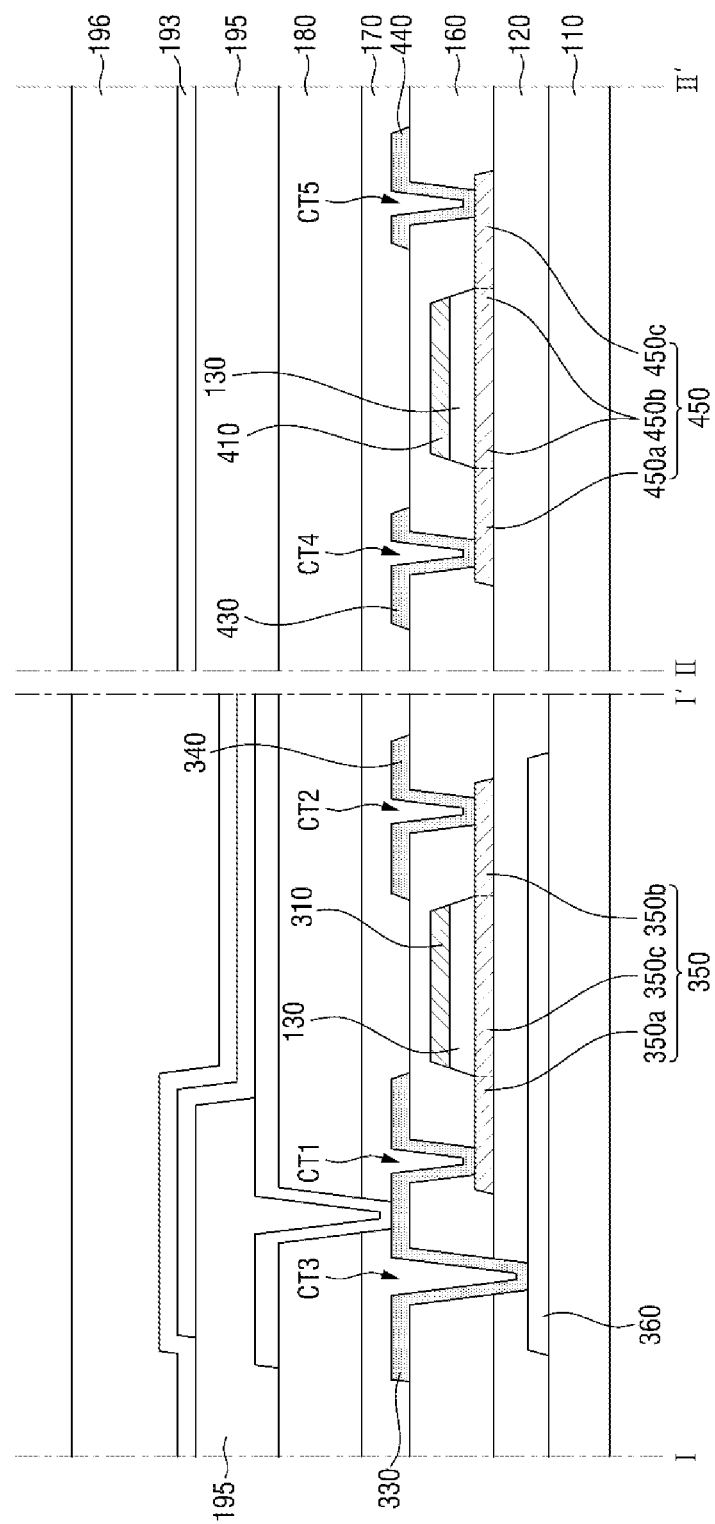

Next, a first gate insulating layer 130 is formed on the first active layer 350 and the second active layer 450 as illustrated in FIGS. 18 and 19, and a first interlayer insulating layer 160, first and second source electrodes 330 and 430 and first and second drain electrodes 340 and 440 are formed to form a driving transistor DT and a switching transistor ST. The first and second source electrodes 330 and 430 and the first and second drain electrodes 340 and 440 may be formed by patterning a metal layer, which is formed on the first interlayer insulating layer 160 using sputtering, in an etching process using a photoresist pattern, but exemplary embodiments are not limited to this case.

Finally, as illustrated in FIG. 19, a first protective layer 170, a first planarization layer 180, a first electrode 191, an organic light emitting layer 192, a pixel defining layer 195, a second electrode 193 and an encapsulation layer 196 are formed.

The structures of driving transistors and switching transistors according to exemplary embodiments will now be described.

Figure 20:
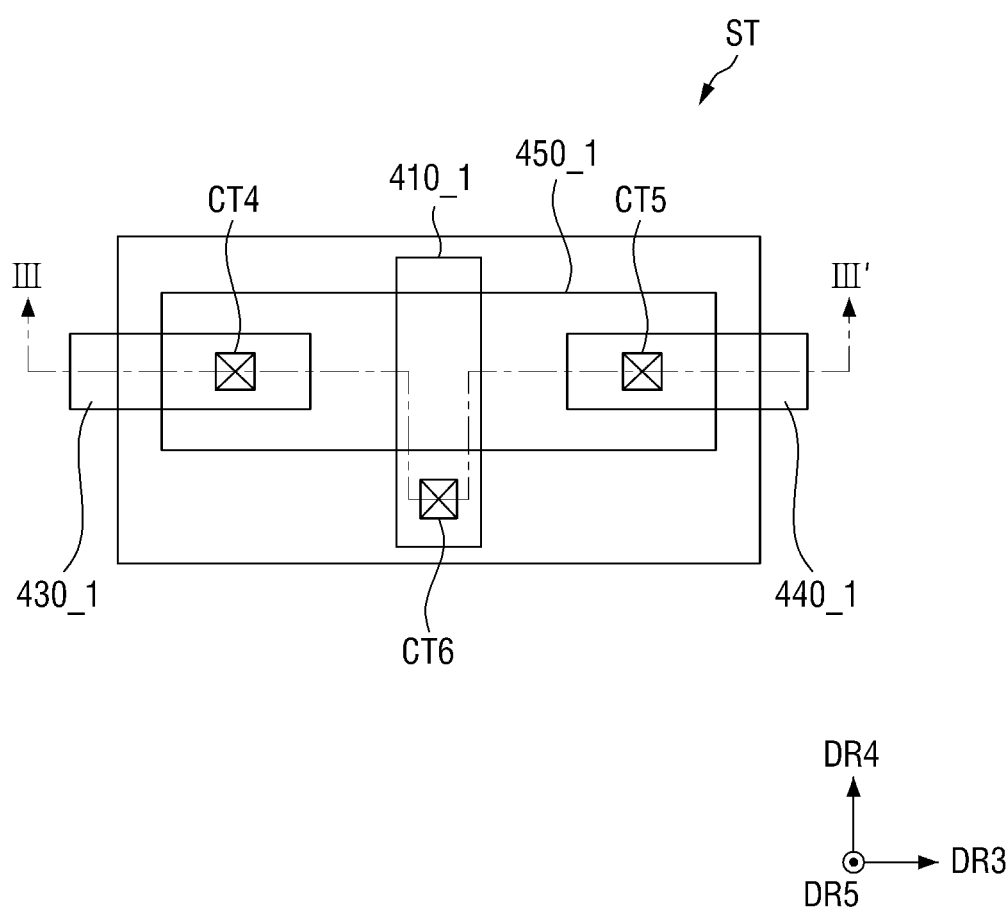
FIG. 20 is a plan view of a switching transistor according to an exemplary embodiment.
Figure 21:
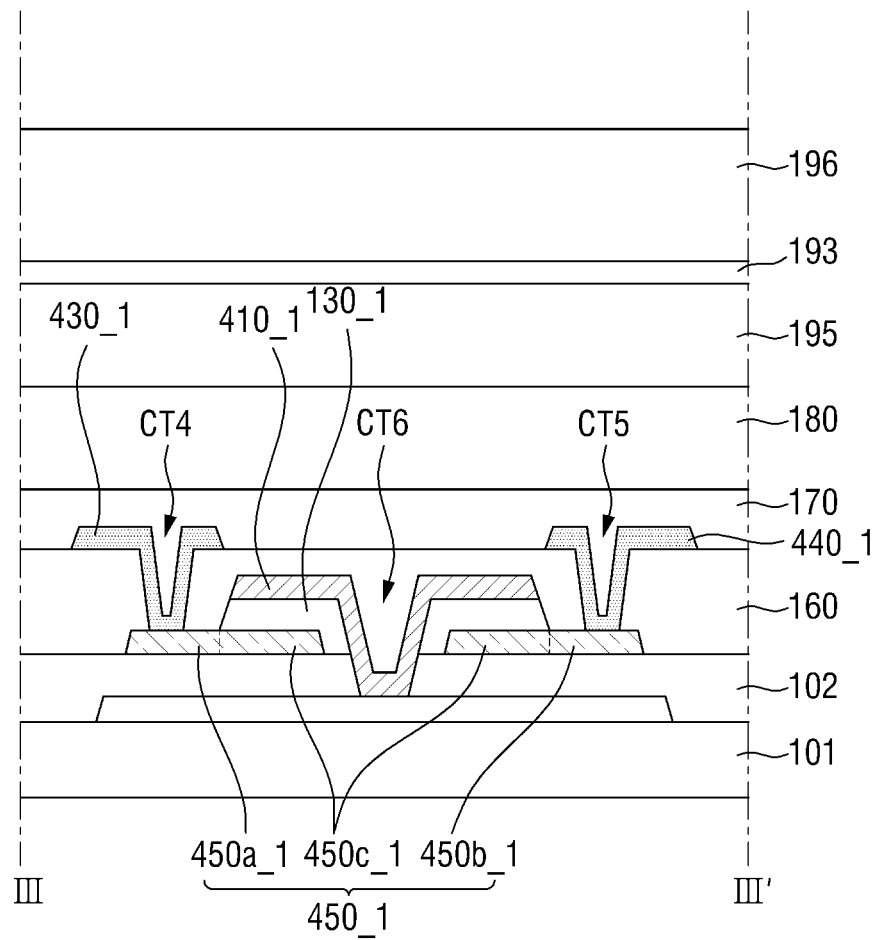
FIG. 21 is a cross-sectional view taken along line III-III' of FIG. 20.

FIG. 20 is a plan view of a switching transistor according to an exemplary embodiment. FIG. 21 is a cross-sectional view taken along line III-III' of FIG. 20.

The switching transistor ST_1 of FIGS. 20 and 21 may further include a second light shielding layer 460_1. The switching transistor ST_1 of FIG. 21 is the same as the switching transistor ST of FIG. 7 except that it further includes the second light shielding layer 460_1 and that a second gate electrode 410_1 is connected to the second light shielding layer 460_1. Any redundant description will be omitted, and differences will be described below.

Referring to FIGS. 20 and 21, the switching transistor ST_1 may include the second gate electrode 410_1, a second active layer 450_1, a second source electrode 430_1, a second drain electrode 440_1, and the second light shielding layer 460_1.

The second light shielding layer 460_1 is disposed on a first substrate 110. The second light shielding layer 460_1 may prevent external light from being incident on the second active layer 450_1 through the first substrate 110. Lengths of the second light shielding layer 460_1 in the fourth direction DR4 and the fifth direction DR5 may be greater than lengths of the second active layer 450_1 in the fourth direction DR4 and the fifth direction DR5. The second light shielding layer 460_1 may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same. A buffer layer 120 may be formed on the second light shielding layer 460_1.

The second gate electrode 410_1 may contact the second light shielding layer 460_1 through a sixth contact hole CT6. The sixth contact hole CT6 may pass through a first gate insulating layer 130_1 and the buffer layer 120 to expose the second light shielding layer 460_1. In this case, the second light shielding layer 460_1 disposed under the second active layer 450_1 and the second gate electrode 410_1 have the same voltage. That is, the second gate electrode 410_1 may serve as a top gate electrode, and the second light shielding layer 460_1 may serve as a bottom gate electrode. Therefore, since the switching transistor ST_1 can be driven in a double-gate manner, it is possible to prevent or reduce the flow of a leakage current through a channel region 450*c*_1 of the second active layer 450_1 of the switching transistor ST_1 when the switching transistor ST_1 is turned off.

Figure 22:
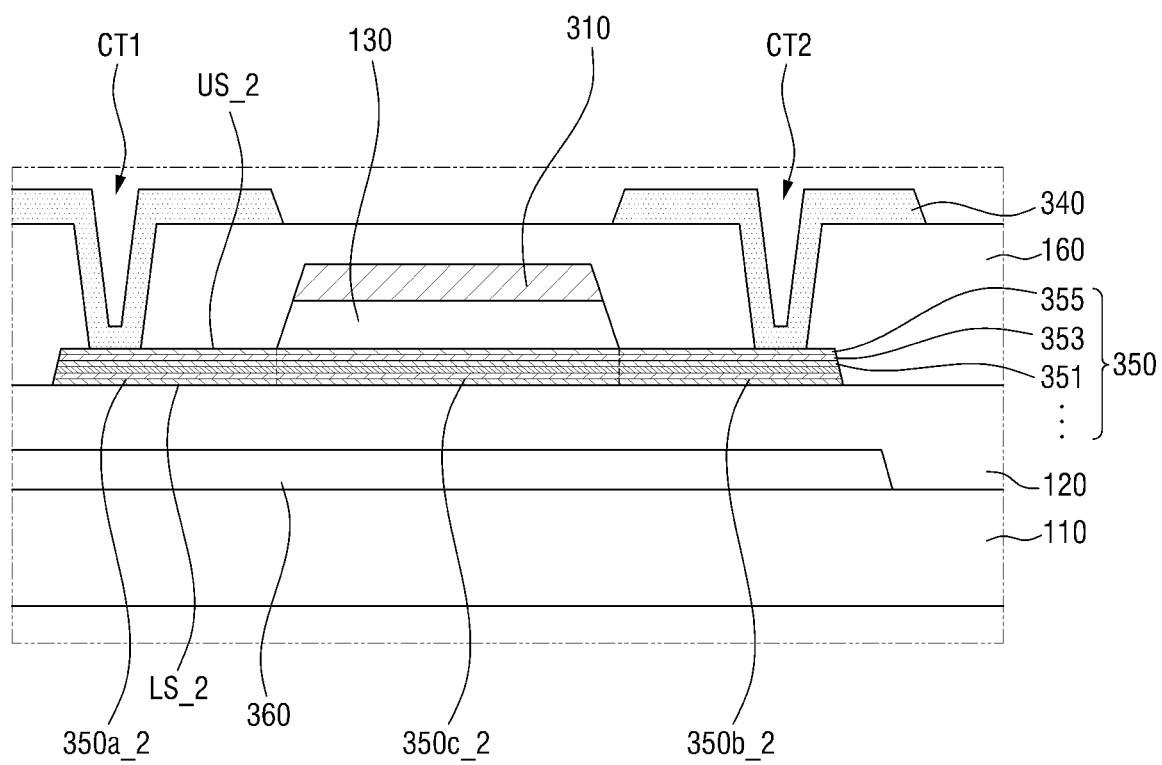
FIG. 22 is a cross-sectional view of a driving transistor according to an exemplary embodiment.

FIG. 22 is a cross-sectional view of a driving transistor DT_2 according to an exemplary embodiment.

The driving transistor DT_2 of FIG. 22 is the same as the driving transistor DT of FIG. 9 except that a first active layer 350_2 includes a larger number of oxide layers. Any redundant description will be omitted, and differences will be described below.

Referring to FIG. 22, unlike in the driving transistor DT of FIG. 9, in the driving transistor DT_2 of FIG. 22, oxide layers 351, 353 and 355 included in the first active layer 350_2 may be three or more layers. They may be formed by repeating the ALD cycle SC described with reference to FIGS. 11 and 12 several times. That is, the first active layer 350_2 of FIG. 22 may be formed by repeating the first deposition cycle C1, the second deposition cycle C2 and the third deposition cycle C3 at least twice. A plurality of unit stacks, in each of which a first oxide layer 351, a second oxide layer 353 and a third oxide layer 355 are stacked from a lower surface LS_2 of the first active layer 350_2 toward an upper surface US_2, are formed.

According to an exemplary embodiment, the content of tin in the first active layer 350_2 may partially increase or decrease repeatedly from the lower surface LS_2 toward the upper surface US_2. For example, when the third oxide layer 355 is tin oxide, the tin content may increase from the lower surface LS_2 to a position where a third oxide layer 355 is formed. On the other hand, the tin content may partially decrease from the position where the third oxide layer 355 is formed to a position above the position. Like this, when the first active layer 350_2 is formed by repeating the ALD cycle SC several times, the tin content of the first active layer 350_2 may have various distributions according to position.

Figure 23:
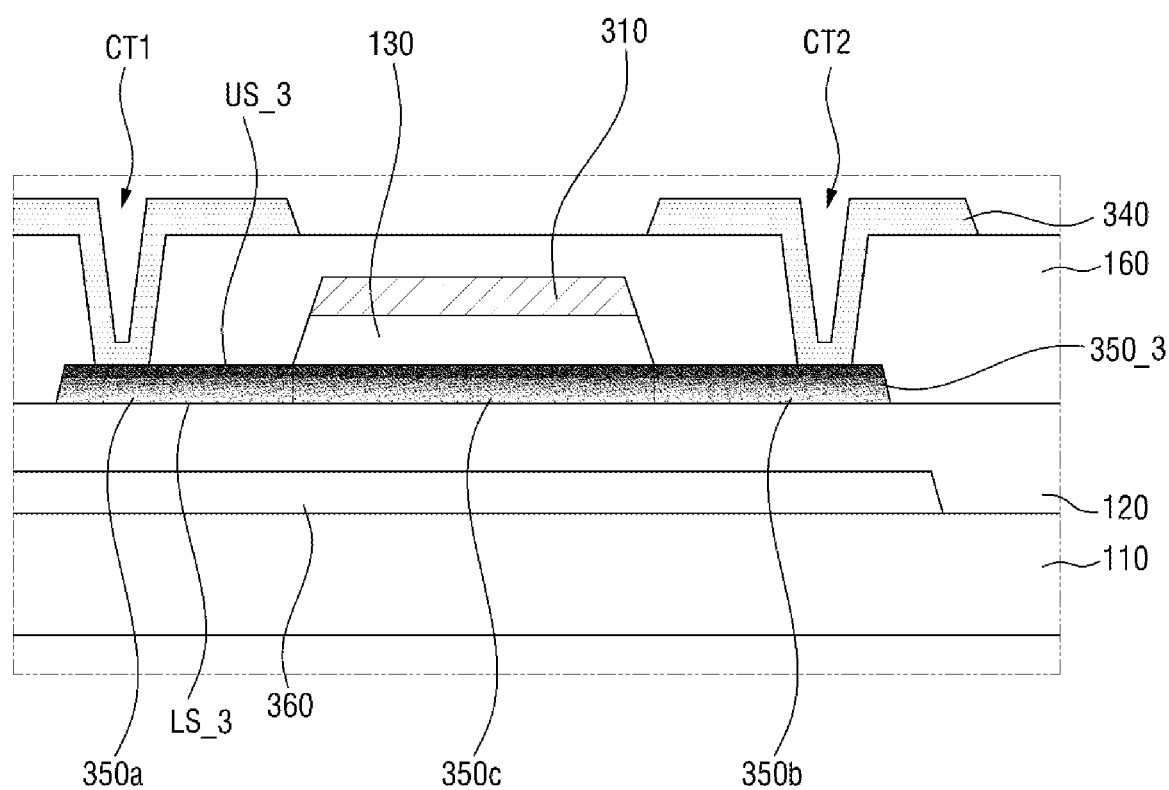
FIG. 23 is a cross-sectional view of a driving transistor according to an exemplary embodiment.

FIG. 23 is a cross-sectional view of a driving transistor DT_3 according to an exemplary embodiment.

The driving transistor DT_3 of FIG. 23 is the same as the driving transistor DT of FIG. 5 except that a first active layer 350_3 includes an oxide semiconductor into which a plurality of oxide layers are integrated and that tin content varies according to position in the oxide semiconductor. Any redundant description will be omitted, and differences will be described below.

As described above, after an ALD cycle SC is performed, a predetermined heat treatment process may be performed to integrate a plurality of oxide layers into one oxide semiconductor. Here, the distribution of tin in one oxide semiconductor may be controlled by adjusting the time and temperature of the heat treatment process.

Referring to FIG. 23, the tin content of the first active layer 350_3 according to an exemplary embodiment may change linearly from an upper surface US_3 toward a lower surface LS_3. For example, when the third oxide layer 355 is tin oxide and tin oxide is formed adjacent to the upper surface US_3 of the first active layer 350_3, the tin content of the first active layer 350_3 of FIG. 23 may decrease linearly from the upper surface US_3 toward the lower surface LS_3. Alternatively, when a deposition cycle for forming tin oxide is performed first, the tin content of the first active layer 350_3 may increase linearly from the upper surface US_3 toward the lower surface LS_3.

Hereinafter, experiments for evaluating characteristics of thin-film transistors including oxide semiconductor active layers formed using ALD according to an exemplary embodiment will be described.

Production Example 1: Production of
Indium-Zinc-Tin Oxide (IZTO) (111) Thin Film An indium-zinc-tin oxide thin film was produced using ALD as an oxide semiconductor. The indium-zinc-tin oxide was produced by performing ALD cycles for forming indium oxide, zinc oxide and tin oxide, which is the same as described above with reference to FIGS. 11 and 12. That is, each metallic oxide thin film was formed by performing one ALD cycle including metal precursor injection, purge, oxidizing gas injection, and purge processes.

Specifically, in order to deposit an indium oxide thin film, InCa-1 was injected as an indium precursor for 1 second, followed by purging for 10 seconds. Then, $H_2O_2$ gas was injected for 0.5 seconds, followed by purging for 10 seconds. This indium (In) cycle was performed once to form an indium oxide ($In_2O_3$) thin film.

Next, in order to form a zinc oxide thin film on the indium oxide thin film, diethylzinc (DEZ) was injected as a zinc precursor for 0.3 seconds, followed by purging for 10 seconds. Then, $H_2O_2$ gas was injected for 0.5 seconds, followed by purging for 10 seconds. This zinc (Zn) cycle was performed once to form a zinc oxide (ZnO) thin film.

Next, in order to form a tin oxide thin film on the zinc oxide thin film, tetrakis[dimethylamino]tin (TDMASn) was injected as a tin precursor for 1 second, followed by purging for 10 seconds. Then, $H_2O_2$ gas was injected for 0.5 seconds, followed by purging for 10 seconds. This tin (Sn) cycle was performed once to form a tin oxide (SnO) thin film.

Through the above process, an IZTO 1:1:1 thin film (hereinafter, referred to as Production Example 1) was produced by performing the indium cycle, the zinc cycle and the tin cycle in a ratio of 1:1:1.

Production Example 2: Production of Indium-Zinc-Tin Oxide (IZTO) (112) Thin Film An IZTO 1:1:2 thin film (hereinafter, referred to as Production Example 2) was produced in the same manner as in Production Example 1 except that the tin cycle for forming a tin oxide thin film was performed twice.

Comparative Example 1: Production of Indium-Zinc Oxide (IZO) (110) Thin Film

An IZO 1:1:0 thin film (hereinafter, referred to as Comparative Example) was produced in the same manner as in Production Example 1 except that the tin cycle for forming a tin oxide thin film was performed zero times.

Experimental Example 1: Comparison of Compositions of Oxide Thin Films

A ratio between elements present in each of the oxide thin films of Production Example 1, Production Example 2 and Comparative Example 1 was analyzed using Auger electron spectroscopy (AES). The results are shown in FIG. 24 and Table 1 below.

TABLE 1

| Thin Film | C (wt. %) | In (wt. %) | Sn (wt. %) | Zn (wt. %) | O (wt. %) |
|---|---|---|---|---|---|
| Comparative Example 1 (1:1:0) | 0.7 | 19.3 | 0 | 29.6 | 49.8 |
| Production Example 1 (1:1:1) | 1.1 | 17.0 | 9.0 | 20.6 | 51.4 |
| Production Example 2 (1:1:2) | 2.1 | 15.2 | 15.8 | 14.8 | 51.7 |

Figure 24:
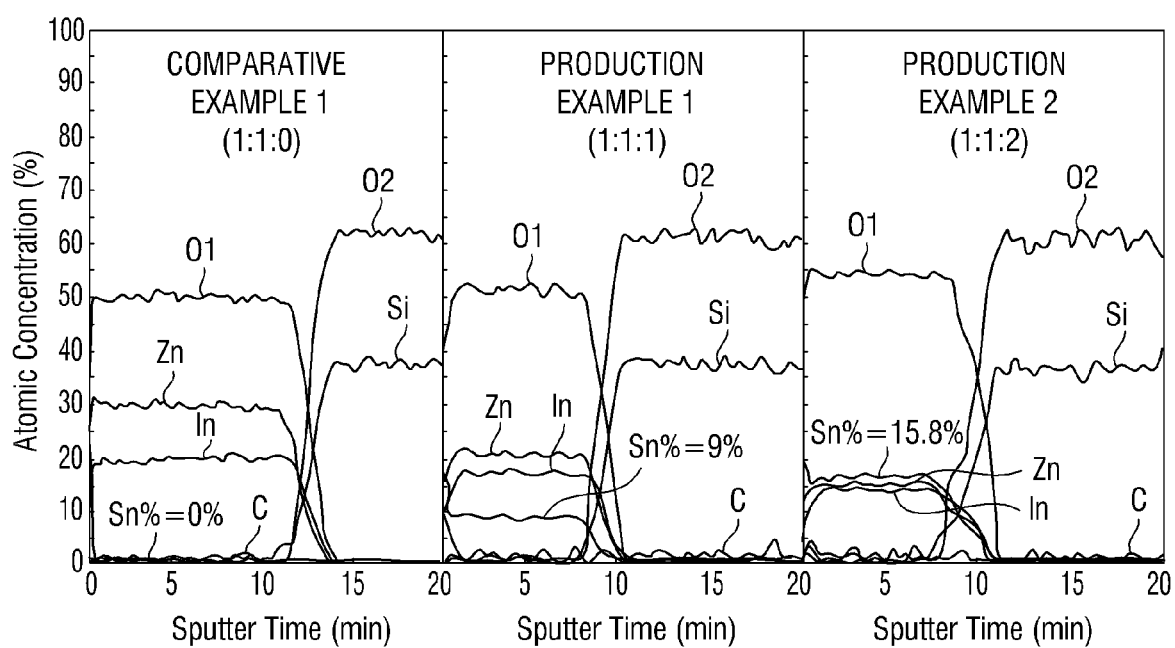
FIG. 24 illustrates graphs showing the results of Auger electron spectroscopy (AES) analysis of oxide thin films according to an experimental example.

FIG. 24 illustrates graphs showing the results of AES analysis of oxide thin films according to an experimental example.

Referring to FIG. 24 and Table 1, the tin content of the IZO thin film was 0 wt. % when the tin cycle was performed zero times (Comparative example 1). In addition, the tin contents of the IZTO thin films were 9.0 wt. % and 15.8 wt. % when the tin cycle was performed once and twice (Production Example 1 and Production Example 2), respectively.

Therefore, when an oxide thin film is produced using ALD, it is possible to adjust the tin content of the oxide thin film relatively precisely by controlling the number and proportion of ALD cycles.

Experimental Example 2: Evaluation of Chemical Resistance Characteristics of Oxide Thin Films (1)

The chemical resistance characteristics of the oxide thin films of Production Example 1, Production Example 2 and Comparative example 1 were evaluated. The chemical resistance characteristics were evaluated by measuring a refractive index n and resistance R after acetone treatment, after developer treatment, and after stripper treatment. The acetone treatment was performed for 3 minutes, the developer treatment was performed for 48 seconds, and the stripper treatment was performed for 3 minutes. The results of evaluating the chemical resistance characteristics of the oxide thin films are shown in Table 2 below.

TABLE 2

| Thin Film | Before | | After Acetone 3 min | | After Developer 48 s | | After Stripper 3 min | |
|---|---|---|---|---|---|---|---|---|
| | n | R | n | R | n | R | n | R |
| Comparative Example 1 (1:1:0) | 2.06 | 37.1 kΩ | 1.69 | 2.7 MΩ | 1.60 | 3.1 MΩ | 1.65 | 8.3 MΩ |
| Production Example 1 (1:1:1) | 2.05 | 271.5 kΩ | 2.02 | 954.8 kΩ | 2.03 | 1.4 MΩ | 2.03 | 6.1 MΩ |
| Production Example 2 (1:1:2) | 2.04 | 12.3 kΩ | 2.03 | 16.5 kΩ | 2.01 | 13.5 kΩ | 2.03 | 11.6 kΩ |

In Table 2, n indicates a refractive index of an oxide thin film, and R indicates a resistance value of the oxide thin film. Referring to Table 2, a change in refractive index caused by solution treatment was smaller in Production Example 1 and Production Example 2 which are oxide thin films containing tin than in Comparative example 1 which is an oxide thin film not containing tin. In addition, a change in resistance value caused by solution treatment was smaller in Production Example 2 containing 15.8 wt. % of tin than in Production Example 1 containing 9.0 wt. % of tin.

That is, it can be seen an oxide thin film has excellent chemical resistance when containing tin in a specific amount, for example, in an amount of about 10 wt. % to about 16 wt. %.

Experimental Example 3: Evaluation of Chemical Resistance Characteristics of Oxide Thin Films (2)

The chemical resistance characteristics of the oxide thin films of Production Example 1, Production Example 2 and Comparative Example 1 were evaluated. The chemical resistance characteristics were evaluated by measuring etching rates of 20 nm of the produced oxide thin films using a hydrofluoric acid (HF) 200:1 etchant and an ITO etchant. The results are shown in Table 3.

TABLE 3

| Thin Film (20 nm) | HF 200:1 Etchant | | ITO Etchant (60° C.) | |
|---|---|---|---|---|
| | Time (s) | Rate (nm/s) | Time (s) | Rate (nm/s) |
| Comparative Example 1 (1:1:0) | 3 | 7 | 1 | 20 |
| Production Example 1 (1:1:1) | 75 | 0.2 | 5 | 4 |
| Production Example 2 (1:1:2) | — | — | 50 | 0.4 |

In Table 3, Time indicates the time required to etch 20 nm of oxide thin film when the oxide thin film is etched using each etchant, and Rate indicates an etching rate for each etchant.

Referring to Table 3, Production Example 1 and Production Example 2 which are oxide thin films containing tin had greater chemical resistance to the HF etchant and the ITO etchant than Comparative Example 1. In particular, Production Example 2 containing 15.8 wt. % of tin had a lower etching rate to the ITO etchant than Production Example 1.

That is, it can be seen that an oxide thin film containing tin has excellent chemical resistance and etching rate. In addition, when an ITO electrode is used, masks can be reduced through the etching rate.

Experimental Example 4: Evaluation of Defects of Oxide Thin Films

Defect characteristics of the oxide thin films of Production Example 1, Production Example 2 and Comparative Example 1 were evaluated. The oxide thin films of Production Example 1, Production Example 2 and Comparative Example 1 were analyzed using X-ray photoelectron spectroscopy (XPS) to measure an oxygen (O)-deficient ratio and an oxygen (O)-metal (M) ratio in the oxide thin films. The results are shown in Table 4 and FIG. 25.

TABLE 4

| Thin Film | O-M | O-deficient | O-H/C |
|---|---|---|---|
| Comparative Example 1 (1:1:0) | 43.1 | 18.0 | 38.9 |
| Production Example 1 (1:1:1) | 58.8 | 17.5 | 23.6 |
| Production Example 2 (1:1:2) | 70.6 | 14.6 | 14.8 |

Figure 25:
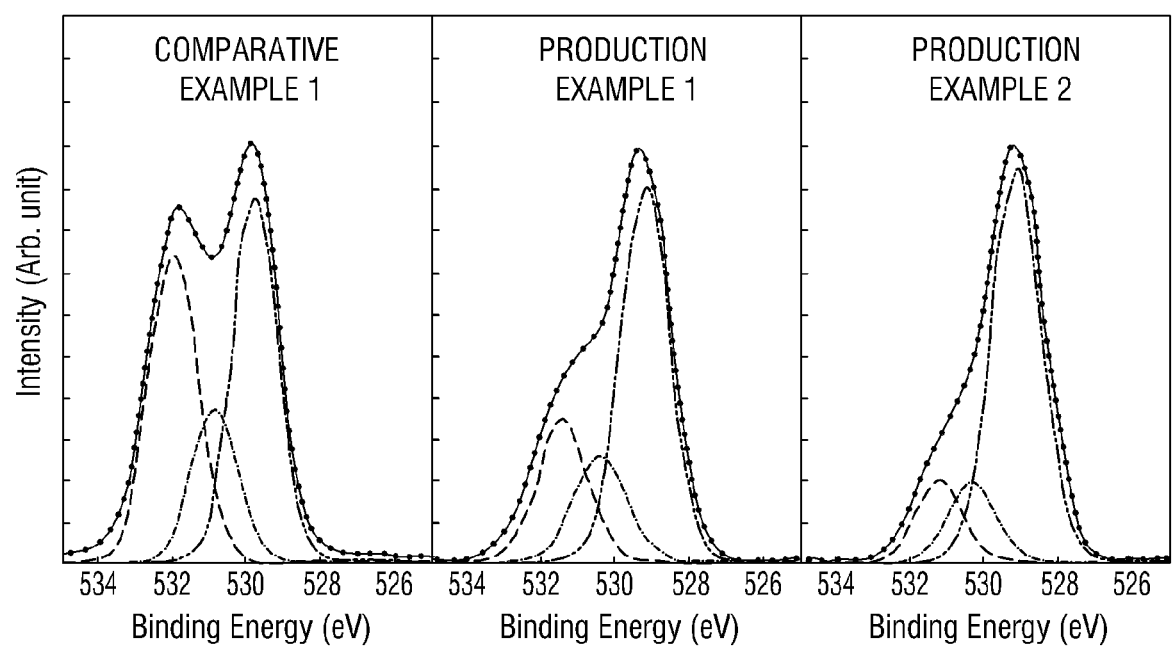
FIG. 25 illustrates graphs showing the results of X-ray photoelectron spectroscopy (XPS) analysis of the oxide thin films according to an experimental example.

FIG. 25 illustrates graphs showing the results of XPS analysis of the oxide thin films according to an experimental example.

Referring to FIG. 25 and Table 4, as the proportion of the tin cycle increased (Production Example 2), the O-deficient ratio in the oxide thin film decreased, and the O-M ratio increased. That is, it is possible to adjust the O-deficient and O-M ratios in an oxide thin film by controlling the number and proportion of ALD cycles when the oxide thin film is produced.

Figure 26:
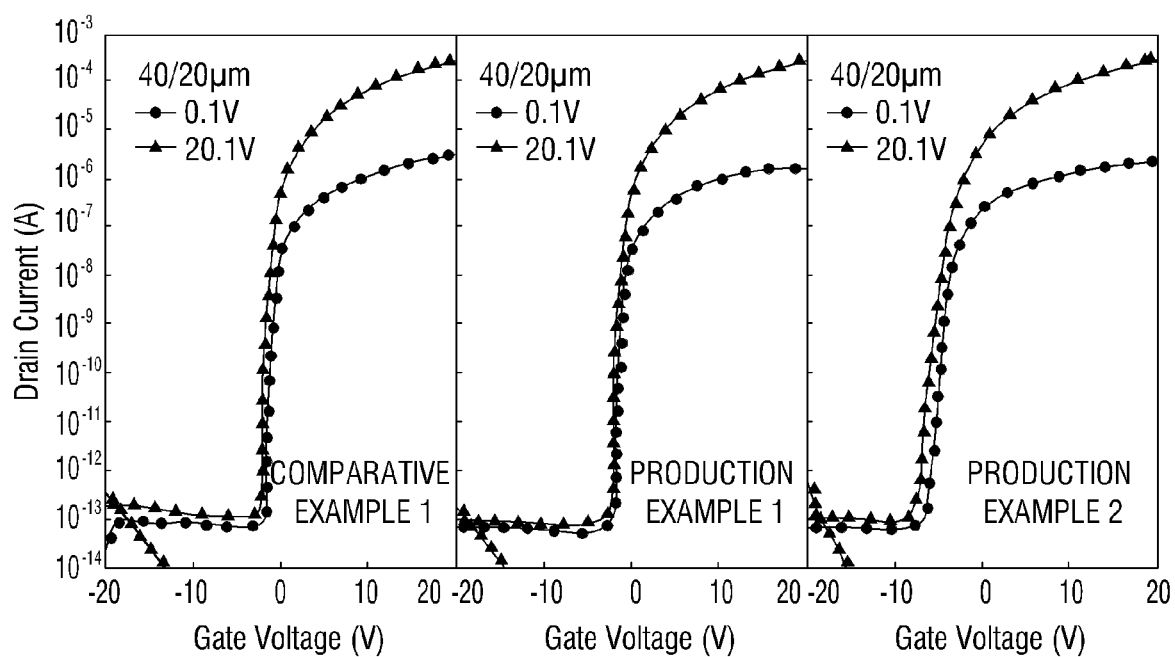
FIGS. 26 and 27 are graphs showing the results of evaluating device characteristics and reliability of thin-film transistors according to an experimental example.

Experimental Example 5: Evaluation of Characteristics and Reliability of Elements Including Oxide Thin Films Thin-film transistors using the oxide thin films of Production Example 1, Production Example 2 and Comparative Example 1 were manufactured, and device characteristics and reliability of the thin-film transistors were evaluated. The device characteristics of the thin-film transistors including the oxide thin films of Production Example 1, Production Example 2 and Comparative Example 1 were evaluated, and the results are shown in FIG. 26 and Table 5 below. The positive bias temperature stress (PBTS) reliability of the thin-film transistors was evaluated, and the results are shown in FIG. 27.

TABLE 5

| Thin Film | Comparative Example 1 (1:1:0) | Production Example 1 (1:1:1) | Production Example 2 (1:1:2) |
|---|---|---|---|
| Vth[V] | −1.2 ± 0.3 | −1.4 ± 0.2 | −3.63 ± 0.3 |
| μeff [$cm^2/Vs$] | 19.2 ± 0.5 | 26.8 ± 0.4 | 22.4 ± 0.2 |
| μsat [$cm^2/Vs$] | 18.0 ± 0.6 | 27.8 ± 0.3 | 22.7 ± 0.2 |
| S.S. [V/decade] | 0.25 ± 0.01 | 0.28 ± 0.03 | 0.41 ± 0.03 |
| Hysteresis [V] | 0.32 ± 0.03 | 0.28 ± 0.02 | 0.25 ± 0.02 |
| Ion/Ioff | 2.4E+10 | 3.8E+11 | 1.7E+11 |

Figure 27:
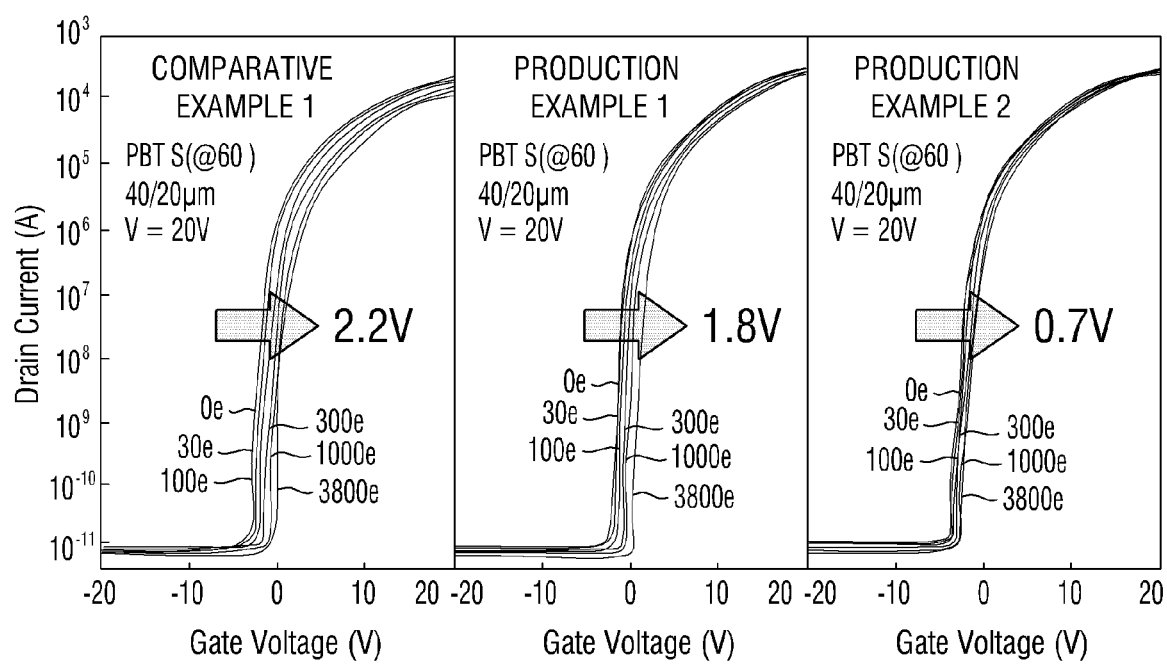

FIGS. 26 and 27 are graphs showing the results of evaluating the device characteristics and reliability of thin-film transistors according to an experimental example.

Referring to FIGS. 26 and 27 and Table 5, a thin-film transistor exhibiting the best device characteristics among the thin-film transistors including the oxide thin films of Production Example 1, Production Example 2 and Comparative Example 1 was Production Example 1 in which the tin cycle was performed once. On the other hand, Production Example 2 in which the tin cycle was performed twice exhibited the best reliability characteristics in PBTS reliability evaluation. In the PBTS reliability evaluation, a gate voltage (V) of Comparative Example 1 was changed by 2.2 V, whereas gate voltages of Production Examples 1 and 2 were changed by 1.8 V and 0.7 V, respectively. That is, it is possible to produce an oxide thin film containing a specific amount of tin by adjusting the number and proportion of tin cycles, and a thin-film transistor including this oxide thin film can have excellent device characteristics and reliability characteristics.

In a method of manufacturing a display device according to an exemplary embodiment, an active layer of an oxide semiconductor can be produced using ALD such that the content of a specific metal is in a specific range. Accordingly, a thin-film transistor including the produced active layer of the oxide semiconductor has excellent device characteristics and chemical resistance.

In addition, in a display device according to an exemplary embodiment, a driving transistor and a switching transistor in each pixel may be formed as thin-film transistors, each including an active layer of an oxide semiconductor produced by ALD.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a display device, the method comprising the steps of:
   forming an active layer, which comprises at least one oxide layer, on a target substrate using atomic layer deposition (ALD); and
   forming at least one thin-film transistor comprising the active layer,
   wherein the at least one oxide layer comprises at least one first oxide layer containing indium (In) and at least one second oxide layer containing Sn.

2. The method of claim 1, wherein the step of forming of the active layer comprises performing an ALD cycle for forming the at least one oxide layer at least once, and the ALD cycle comprises a first deposition cycle for forming the first oxide layer on the target substrate and a second deposition cycle for forming the second oxide layer on the first oxide layer.

3. The method of claim 2, wherein the ALD cycle further comprises a third deposition cycle for forming a third oxide layer containing Zinc (Zn) between the second oxide layer and the first oxide layer.

4. The method of claim 3, wherein, in the ALD cycle, the second deposition cycle is performed one or more times, and the first deposition cycle and the third deposition cycle are performed in equal proportions.

5. The method of claim 1, wherein the active layer comprises indium-tin oxide (ITO), indium-zinc-tin oxide (IZTO), indium-gallium-tin oxide (IGTO), or indium-gallium-zinc-tin oxide (IGZTO).

6. The method of claim 5, wherein content of the Sn in the active layer ranges from about 10 wt. % to about 16 wt. %.

* * * * *